(12) United States Patent
Tsuchiya

(10) Patent No.: US 8,222,653 B2
(45) Date of Patent: Jul. 17, 2012

(54) LIGHT-EMITTING DIODE AND LIGHTING APPARATUS USING THE SAME

(75) Inventor: Kosuke Tsuchiya, Fujiyoshida (JP)

(73) Assignee: Citizen Electronics Co., Ltd., Yamanashi (JP)

( * ) Notice: Subject to any disclaimer, the term of this patent is extended or adjusted under 35 U.S.C. 154(b) by 185 days.

(21) Appl. No.: 12/401,053

(22) Filed: Mar. 10, 2009

(65) Prior Publication Data
US 2009/0224268 A1    Sep. 10, 2009

(30) Foreign Application Priority Data
Mar. 10, 2008    (JP) ................................ 2008-059715

(51) Int. Cl.
*H01L 33/00* (2010.01)
(52) U.S. Cl. .................................. 257/91; 257/E33.057
(58) Field of Classification Search ............. 257/88, 257/89, 99, 100, E25.002, E25.032, E33.001, 257/E33.068, E33.058, E33.056, E33.062, 257/E33.072, E33.059, 91, E33.057; 438/22, 438/24–27, 29, 46, 66; 313/512, 506
See application file for complete search history.

(56) References Cited

U.S. PATENT DOCUMENTS

| | | | | |
|---|---|---|---|---|
| 6,345,903 B1 * | 2/2002 | Koike et al. | ................. | 362/241 |
| 6,847,116 B2 * | 1/2005 | Isokawa | ................. | 257/736 |
| 7,675,087 B1 * | 3/2010 | Cheng et al. | ................. | 257/99 |
| 7,808,013 B2 * | 10/2010 | Mendendorp et al. | ........ | 257/99 |
| 2002/0001192 A1 * | 1/2002 | Suehiro et al. | ................. | 362/240 |
| 2002/0158261 A1 * | 10/2002 | Lee et al. | ................. | 257/88 |
| 2005/0213321 A1 * | 9/2005 | Lin | ................. | 362/231 |
| 2006/0006406 A1 * | 1/2006 | Kim et al. | ................. | 257/100 |
| 2007/0246731 A1 * | 10/2007 | Isokawa et al. | ................. | 257/99 |
| 2008/0239716 A1 * | 10/2008 | Lin | ................. | 362/219 |

FOREIGN PATENT DOCUMENTS

| | | |
|---|---|---|
| JP | H10-290029 A | 10/1998 |
| JP | 11-163408 A | 6/1999 |
| JP | 2006-165138 A | 6/2006 |
| JP | 2006-517738 | 7/2006 |
| JP | 2006-295085 A | 10/2006 |
| JP | 2007-95797 A | 12/2007 |
| WO | 2004/071141 | 8/2004 |

OTHER PUBLICATIONS

Office Action issued May 17, 2012, in corresponding Japanese patent application No. JP 2008-059715 (7 pages).

* cited by examiner

*Primary Examiner* — Matthew Landau
*Assistant Examiner* — Latanya N Crawford
(74) *Attorney, Agent, or Firm* — Browdy and Neimark, PLLC

(57) ABSTRACT

A light-emitting diode includes a substrate, a light-emitting diode element mounted on an upper surface of the substrate, and a sealing member that covers the light-emitting diode element. At least one pair of lower electrodes electrically connected to the light-emitting diode element and at least one pair of connecting electrodes connected to each other are disposed on the substrate. A connecting wiring pattern for connecting the pair of connecting electrodes is provided between the connecting electrodes.

18 Claims, 16 Drawing Sheets

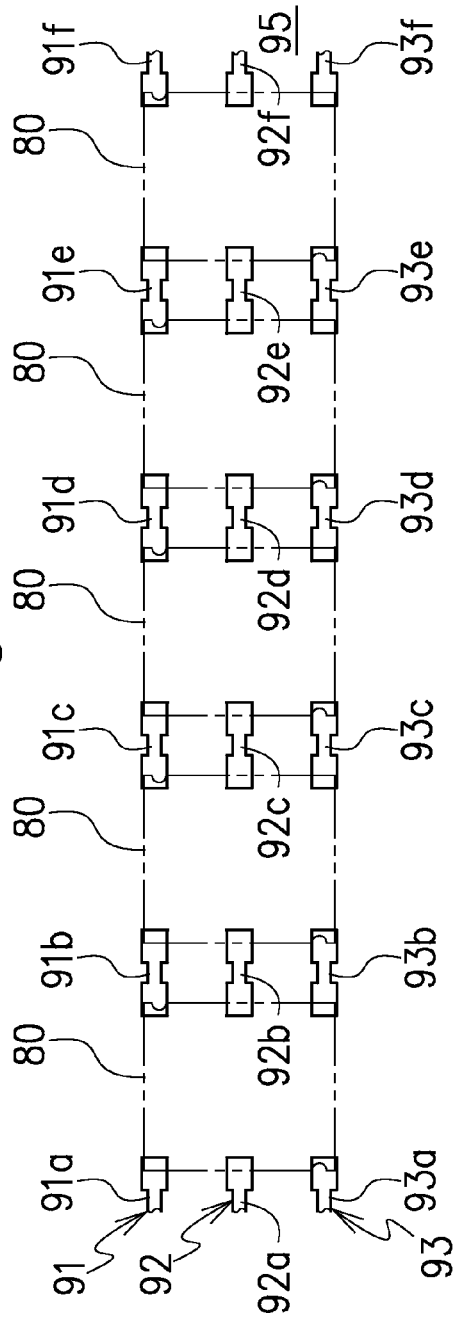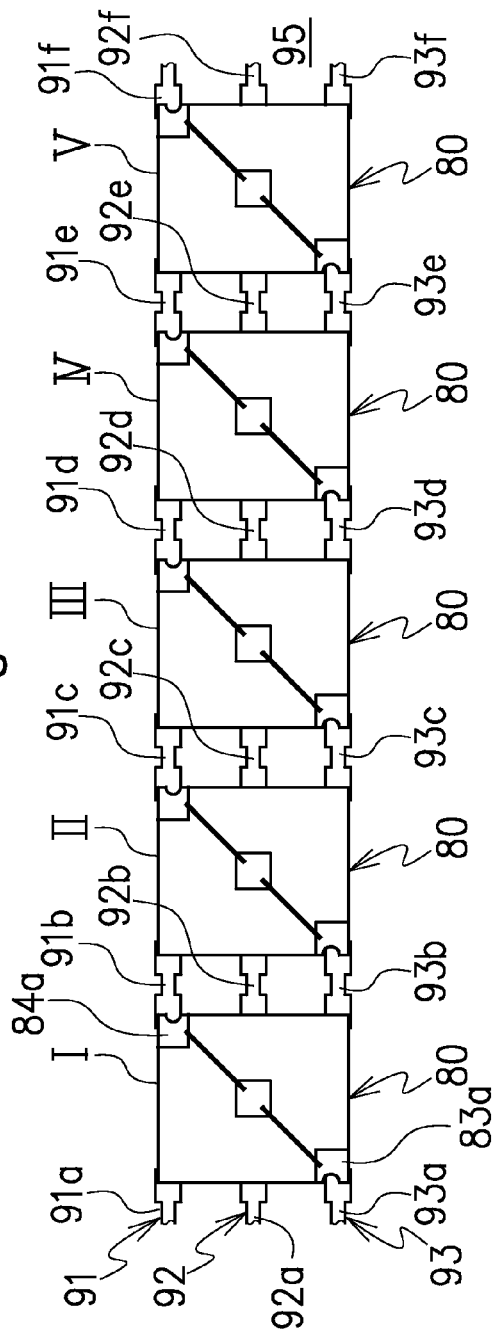

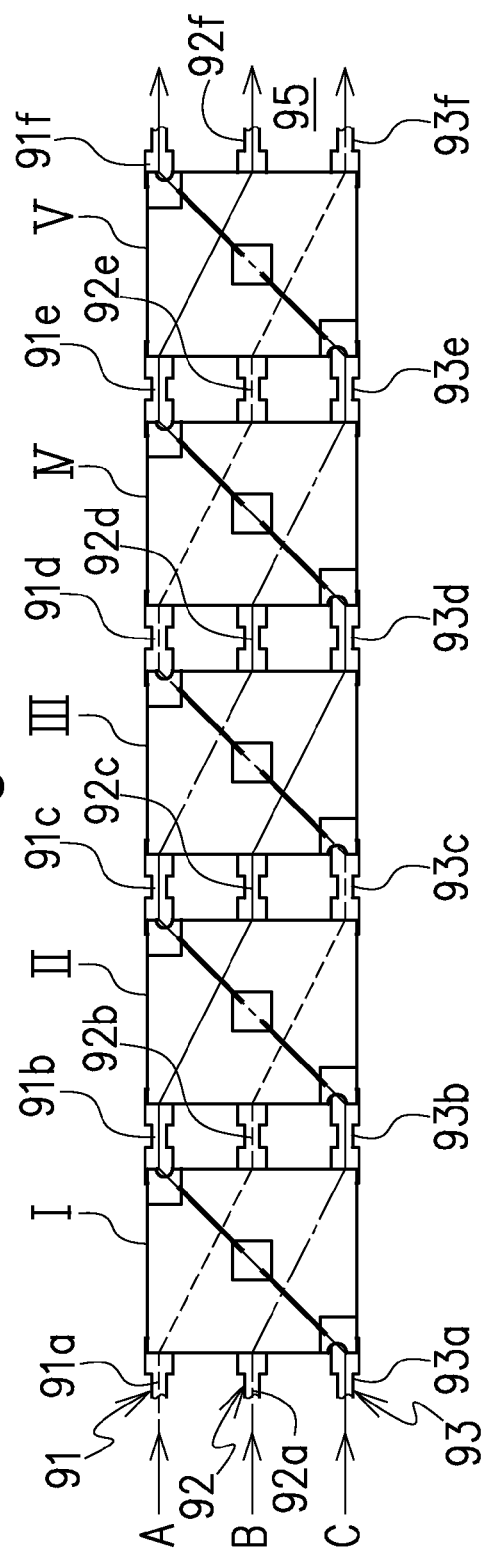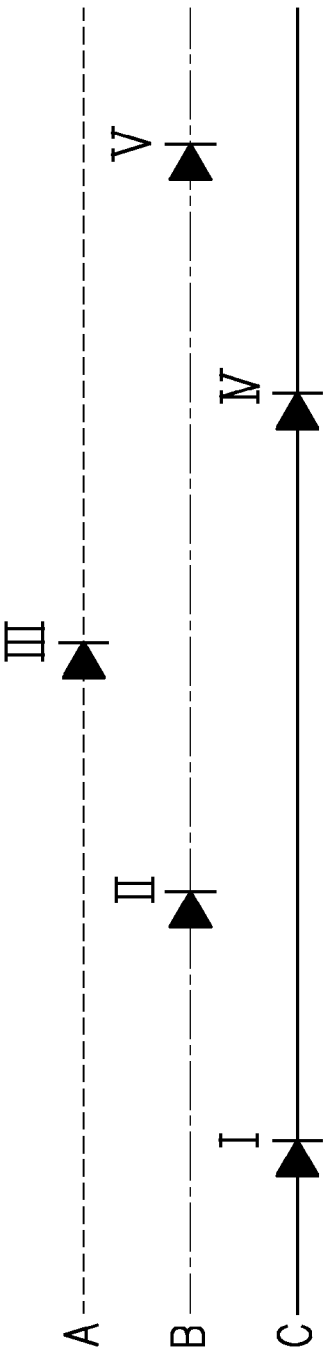

LIGHT-EMITTING DIODE AND LIGHTING APPARATUS USING THE SAME

CROSS-REFERENCE TO THE RELATED APPLICATION

The application claims the priority benefit of Japanese Patent Application No. 2008-059715, filed on Mar. 10, 2008, the entire descriptions of which are incorporated herein by reference.

BACKGROUND OF THE INVENTION

1. Field of the Invention

The present invention relates to a light-emitting diode (LED) and a lighting apparatus using a plurality of the LEDs.

2. Description of the Invention

In one known structure of a conventional LED lighting apparatus, a plurality of LED elements are arranged to increase the brightness of the lighting. An example of such a structure is disclosed in Japanese Patent Application Laid-Open No. 2006-295085.

As shown in FIG. 18, the disclosed LED light source unit 1 includes a base 2 made of a copper alloy or a similar material having high thermal conductivity and a printed circuit board 3 disposed on the base 2 and having an elongated through hole 3a. The printed circuit board 3 includes a pair of wiring patterns 3b and 3c, and each of the wiring patterns 3b and 3c includes on its inward side a plurality of internal connecting electrodes 3d electrically connected to LED elements 4. The wiring patterns 3b and 3c are provided with terminal electrodes 3e and 3f at respective ends. A plurality of the LED elements 4 are mounted on the base 2 through silver paste, and each of the LED elements 4 is connected to the internal connecting electrodes 3d of the wiring patterns 3b and 3c through wires 5 and 6. Although not shown in FIG. 18, a layer of sealing resin is provided on the printed circuit board 3 except for the terminal electrodes 3e and 3f, and the sealing resin covers and protects the LED elements 4 and the wires 5 and 6. With the above configuration, heat is efficiently dissipated.

Another known example of the structure of the arrangement of LED elements is an array of light-emitting diodes disclosed in Japanese Patent Application Laid-Open No. H11-163408.

As shown in FIG. 19, the disclosed light-emitting diode array 10 includes a substrate 11 and a plurality of island-like semiconductor stacks arranged in a line on the substrate 11. Each of the island-like semiconductor stacks has a first conductive semiconductor layer 12 and a second conductive semiconductor layer 13 stacked, and ten island-like semiconductor stacks are shown in FIG. 19. A common electrode 15 is connected to the first conductive semiconductor layers 12, and individual electrodes 14 are connected to the second conductive semiconductor layers 13, and thus, the light-emitting diode array 10 is constituted. Each island-like semiconductor stack is coated with an insulating film (not shown).

In the light-emitting diode array 10, one common individual electrode 14 or one common dummy electrode 17 extending on one end face side of the substrate 11 is connected to the second conductive semiconductor layers 13 of each adjacent pair of the island-like semiconductor stacks. Paired island-like semiconductor stacks connected to the individual electrode 14 and other paired island-like semiconductor stacks connected to the dummy electrodes 17 are alternately arranged. The common electrode 15 includes common electrodes 15a and 15b that are provided on both sides in the arrangement direction of the island-like semiconductor stacks, and the first conductive semiconductor layers 12 of the island-like semiconductor stacks are connected alternately to common electrodes 15a and 15b on both sides.

In the light-emitting diode array 10, the common electrodes 15a and 15b are separately disposed on both sides of the substrate 11, as described above. Therefore, by applying electric current to a combination of electrodes selected from the individual electrodes 14 and the common electrodes 15a and 15b, the island-like semiconductor stacks can be selectively turned on. More specifically, for example, only odd-numbered island-like semiconductor stacks or all the island-like semiconductor stacks can be turned on.

LEDs have excellent characteristics including low power consumption and long life and are therefore used in a wide variety of electronic devices including portable terminal devices such as cellular phones. Under such circumstances, there is an increasing demand for small size LEDs. However, with the above-described LED light source unit 1 and light-emitting diode array 10, following problems are encountered in reducing the size.

In the LED light source unit 1 of the former case, the wiring patterns 3b and 3c are provided on both sides (both sides in the width direction) of the base 2. Therefore, there is a limit to the reduction in the width of the base 2. Moreover, if the LED elements 4 are connected in parallel, the number of operable LED elements is limited. If ten or more LED elements 4 are connected, the wiring patterns must be divided into a plurality of circuit lines. In such a case, for example, the width of the base must be increased, and the circuit may become complicated.

In the light-emitting diode array 10 of the latter case, the wiring structure is divided into blocks in order to allow selective light emission. Therefore, many wiring patterns such as the common electrode 15 and the individual electrodes 14 are provided on both sides (both sides in the width direction) of the substrate 11. These wiring patterns are arranged in rows in the lengthwise direction of the substrate 11. Therefore, the width of the substrate 11 is undesirably large. Since the wiring patterns must be routed between the island-like semiconductor stacks, there is a limit to the reduction in the lengthwise dimension of the substrate 11. Moreover, since a complicated driving circuit is required, the manufacturing cost undesirably increases.

SUMMARY OF THE INVENTION

It is an object of the present invention to provide LEDs that can be reduced in size and manufactured at low cost and to provide a lighting apparatus using such LEDS.

To achieve the above object, an LED according to one aspect of the present invention includes: a substrate including an upper surface, a lower surface, a peripheral side surface between the upper surface and the lower surface; an LED element mounted on an upper surface of the substrate; and a sealing member that covers the LED element. In this LED, the substrate includes, on the lower surface thereof, at least one pair of lower electrodes electrically connected to the LED element, and at least one pair of connecting electrodes. Furthermore, a connecting wiring pattern is disposed between the at least one pair of connecting electrodes and electrically connects the at least one pair of connecting electrodes.

The substrate may be a single-layer substrate or a stacked substrate formed by stacking at least two layers. The connecting wiring pattern may be disposed on the lower surface or the upper surface of the substrate or between layers of the stacked substrate.

The at least one pair of lower electrodes may be disposed adjacent to first two diagonally opposite corners of the substrate, and the at least one pair of connecting electrodes may be disposed adjacent to second two diagonally opposite corners of the substrate.

There may be a pair of upper electrodes that are disposed adjacent to opposite corners on the upper surface of the substrate respectively and electrically connected to the LED element.

There may be a pair of connecting electrodes that are disposed adjacent to another opposite corners on the upper surface of the substrate respectively, and may be a connecting wiring pattern disposed on the upper surface of the substrate, passing between a lower surface of the light-emitting diode element and the upper surface of the substrate. There may be lower electrodes electrically connected to the pair of upper electrodes and the pair of connecting electrodes on the upper surface of the substrate via through-holes, respectively.

An LED lighting apparatus according to another aspect of the present invention includes: a plurality of LEDs according to the one aspect of the present invention; and a mounting substrate on which the plurality of LEDs are mounted. In this LED lighting apparatus, the mounting substrate includes a plurality of wiring patterns that provide electrical connections for the at least one pair of lower electrodes and the at least one pair of connecting electrodes of each of the LEDs. The plurality of wiring patterns may be disposed at regular intervals.

BRIEF DESCRIPTION OF THE DRAWINGS

FIG. 12 is a plan view illustrating a mounting substrate for the LEDs according to the fourth embodiment;

FIG. 13 is a plan view illustrating the mounted state of the LEDs according to the fourth embodiment;

FIG. 14A is a diagram describing the flow of current through the mounted LEDs;

FIG. 14B is a circuit diagram illustrating the ON-OFF states of the mounted LEDs;

DETAILED DESCRIPTION OF THE PREFERRED EMBODIMENTS

Hereinafter, embodiments of the present invention will be described in detail with reference to the accompanying drawings.

Figure 1A:
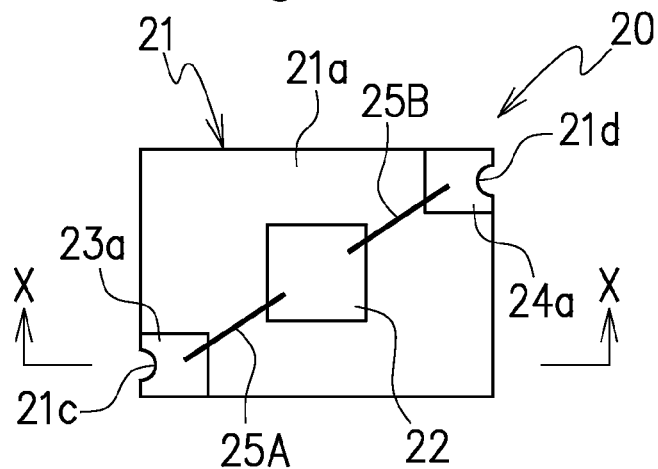
FIG. 1A is a plan view of an LED according to a first embodiment of the present invention.
Figure 1B:
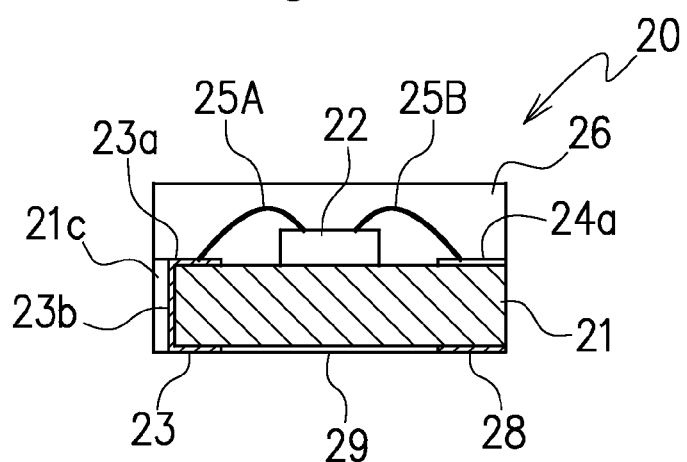
FIG. 1B is a cross-sectional view taken along line X-X in FIG. 1A.

FIGS. 1A through 4B show a first embodiment of an LED according to the present invention. As shown in FIGS. 1A and 1B, the LED 20 according to the present embodiment includes a substrate 21 made of a resin such as glass epoxy resin or BT resin, including an upper surface, a lower surface, and a peripheral side surface between the upper surface and the lower surface, and one LED element 22 mounted on the upper surface 21a of the substrate 21 with an adhesive interposed between a lower surface of the LED element and the upper surface of the substrate. The substrate may have a substantially rectangular shape or a square shape. The LED element 22 includes two electrode portions such as a p-electrode portion and an n-electrode portion. The p-electrode portion is electrically connected through a bonding wire 25A to an upper electrode 23a functioning as an anode electrode that is provided on the upper surface 21a of the substrate 21. The n-electrode portion is connected through a bonding wire 25B to an upper electrode 24a functioning as a cathode electrode that is provided on the upper surface 21a of the substrate 21.

When a predetermined electric current flows from the upper electrode 23a to the LED element 22 through the bonding wire 25A, the LED 20 emits light. Then, the current flows from the LED element 22 through the bonding wire 25B to the upper electrode 24a functioning as the cathode electrode.

Through-holes 21c and 21d are provided at peripheral side surface adjacent to first two diagonally opposite corners of the substrate 21, respectively. The upper electrode 23a is provided adjacent to the through-hole 21c and electrically connected to the through-hole 21c, and the upper electrode 24a is provided adjacent to the through-hole 21d and electrically connected to the through-hole 21d. Through-hole electrode patterns are provided on the inner surfaces of the two through-holes 21c and 21d. The through-hole electrode patterns include a through-hole electrode pattern 23b provided in the through-hole 21c (shown in FIG. 1B) and a through-hole electrode pattern (not shown) provided in the through-hole 21d.

Figure 1C:
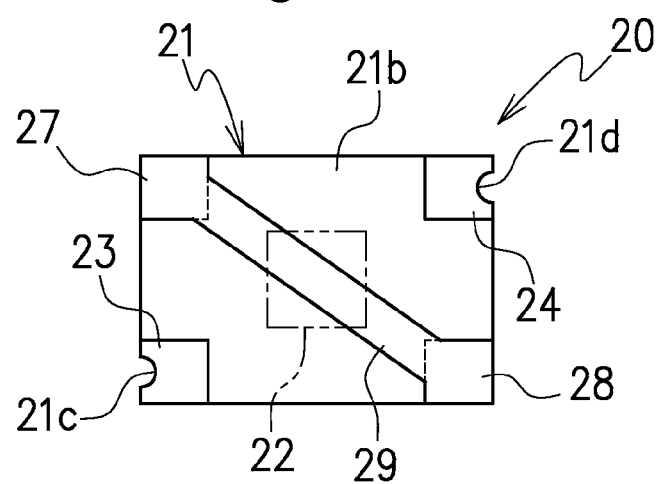
FIG. 1C is a transparent view from the upper side, illustrating the lower surface of the LED shown in FIG. 1A.

As shown in FIG. 1C, a pair of lower electrodes 23 and 24 are provided on the lower surface 21b side of the substrate 21. The lower electrodes 23 and 24 are provided adjacent to the two diagonally opposite corners where the through-holes 21c and 21d are formed at the peripheral side surface, and the lower electrodes 23 and 24 are electrically connected to the through-holes. The lower electrode 23 is connected to the upper electrode 23a through the through-hole electrode pattern 23b, and the electric current flows from the lower electrode 23 to the upper electrode 23a. Similarly, the electric current having passed through the LED element 22 flows to the upper electrode 24a, passes through the through-hole electrode pattern (not shown), and flows to the lower electrode 24. The pair of lower electrodes 23 and 24 are used to electrically connect wiring patterns provided on a mounting substrate, such as a motherboard, described later, to a plurality of LEDs.

In the present embodiment, the two through-holes 21c and 21d are provided at the diagonally opposite corners of the substrate 21 on the peripheral side surface of the substrate, and the through-hole electrode patterns are provided on the inner surfaces of the through-holes 21c and 21d. However, the through-holes are not necessarily provided. The electrode patterns may be provided on the outer side-surfaces at the corners. Any other conventional ways such as electrodes covering a portion of the upper surface, lower surface, and peripheral side surface may be used so long as the lower electrodes are electrically connected to the upper electrodes. Also, through-holes may be half through-holes and quarter through-holes, and plated and filled through-holes may be used.

As shown in FIG. 1C, a pair of connecting electrodes 27 and 28 are provided on the lower surface 21b side of the substrate 21. The connecting electrodes 27 and 28 are provided at two diagonally opposite corners at which the pair of lower electrodes 23 and 24 are not provided. The pair of connecting electrodes 27 and 28 are connected to each other through a connecting wiring pattern 29.

The connecting electrodes 27 and 28 and the connecting wiring pattern 29 are not involved in the light emission of the LED 20. The connecting electrodes 27 and 28 are connected to left and right wiring patterns provided at predetermined intervals on a mounting substrate described later, and the connecting wiring pattern 29 provides electrical continuity between the left and right wiring patterns. More specifically, the connecting electrodes and the connecting wiring pattern allow the electrical continuity between the separated wiring patterns.

The LED 20 of the present embodiment further includes a light-transmitting sealing resin 26 provided on the upper surface 21a side of the substrate 21. The sealing resin 26 protects the LED element 22, the bonding wires 25A and 25B, the electrode patterns 23a and 24a, and like components.

Next, with reference to FIG. 2, a description will be given of the mounting substrate for mounting thereon the LEDs 20 configured as above. Note that examples of such mounting substrates include a motherboard, a dedicated printed circuit board, and like mounting substrates.

Figure 2:
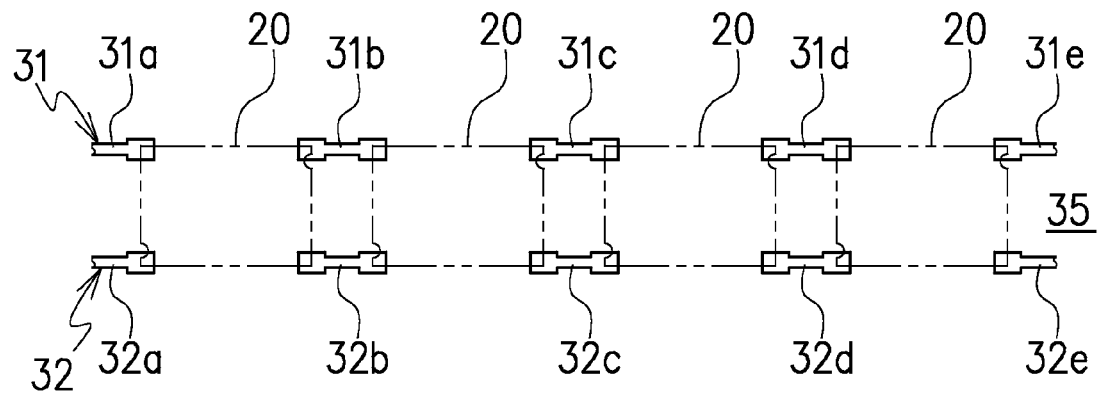
FIG. 2 is a plan view illustrating a mounting substrate to mount the LEDs on the substrate according to the first embodiment.

As shown in FIG. 2, the mounting substrate 35 includes a plurality of wiring patterns 31 and 32 that are disposed in two parallel rows spaced apart at a predetermined spacing. The wiring patterns 31 and 32 are disposed at regular intervals in the lengthwise direction (the left-right (lateral) direction in the figure). Specifically, the wiring patterns 31 include wiring patterns 31a, 31b, 31c, 31d, and 31e arranged in the lengthwise direction at predetermined intervals, and the wiring patterns 32 include wiring patterns 32a, 32b, 32c, 32d, and 32e arranged in the lengthwise direction at predetermined intervals. The predetermined intervals are set to be slightly smaller than the horizontal width of the LEDs 20 to allow for joint width.

The spacing between the wiring patterns 31 and 32 disposed in two parallel rows is substantially the same as the spacing between the lower electrode 23 and the dummy or connecting electrode 27 of the LED 20 (this spacing is the same as the spacing between the lower electrode 24 and the dummy or connecting electrode 28).

Figure 3:
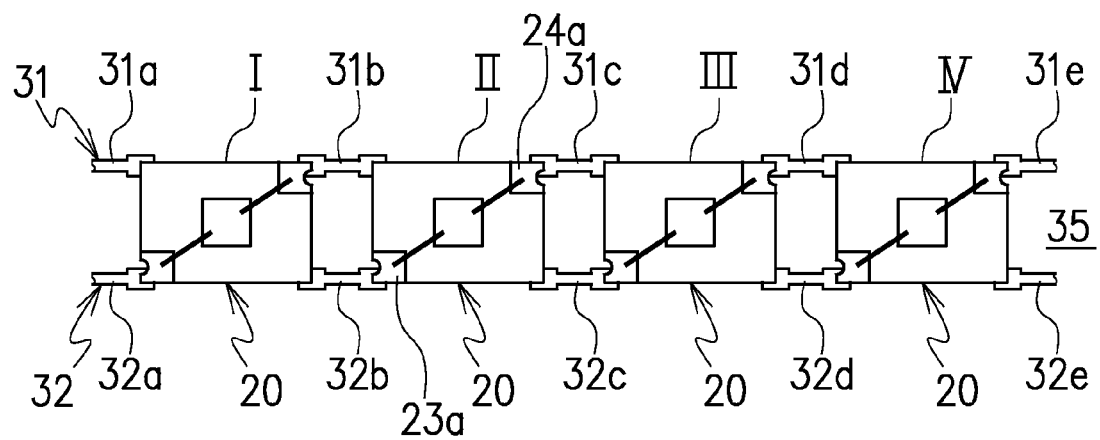
FIG. 3 is a plan view illustrating the mounted state of the LEDs according to the first embodiment on the mounting substrate.

FIG. 3 shows the mounting structure of the LEDs 20 mounted on the wiring patterns 31 and 32 by soldering. As shown in FIG. 3, a plurality of the LEDs 20 are disposed between the wiring patterns 31 and 32, and the pairs of lower electrodes 23 and 24 (see FIG. 1C) and the pairs of connecting electrodes 27 and 28 (see FIG. 1C) of the LEDs 20 are connected to the wiring patterns 31 and 32. More specifically, on the left side ends of the wiring patterns 31 and 32, the wiring patterns 31 are connected to the lower electrodes 24, and the wiring patterns 32 are connected to the connecting electrodes 28. On the right side ends of the wiring patterns 31 and 32, the wiring patterns 31 are connected to the connecting electrodes 27, and the wiring patterns 32 are connected to the lower electrodes 23. The plurality of LEDs 20 are mounted on the wiring patterns 31 and 32 disposed in two parallel rows spaced apart at a predetermined spacing in the manner described above (in FIG. 3, four LEDs 20 are indicated by I to IV).

Figure 4A:
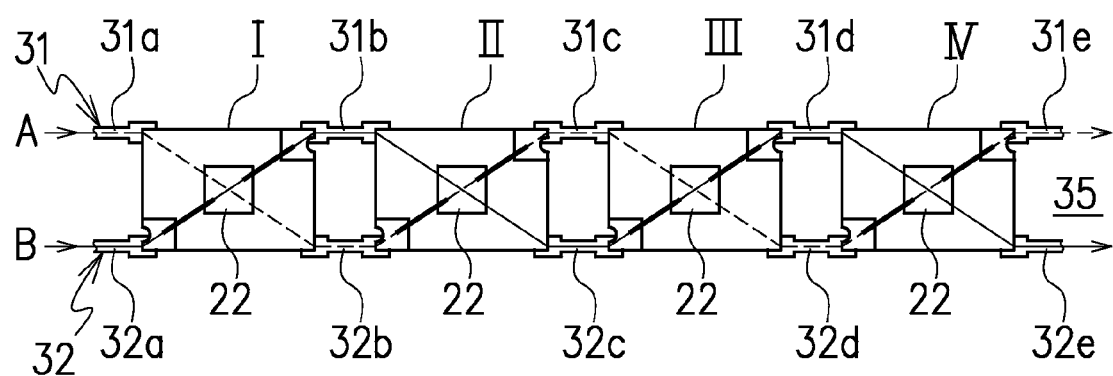
FIG. 4A is a diagram describing the flow of current through the mounted LEDs.
Figure 4B:
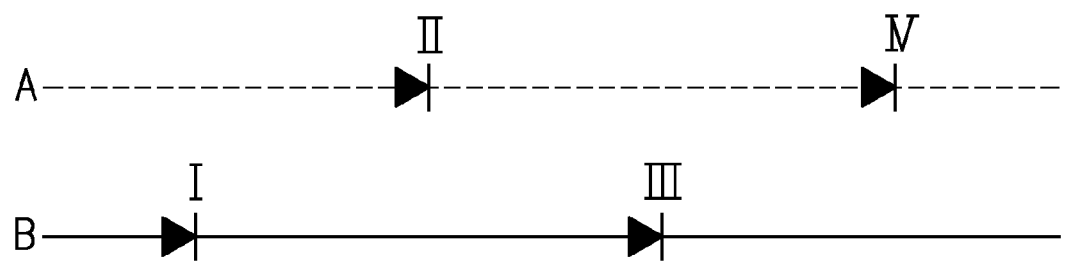
FIG. 4B is a circuit diagram illustrating the ON-OFF states of the mounted LEDs.

FIGS. 4A and 4B are used to illustrate the operational advantage of the mounting structure. The wiring patterns 31 and 32 of the mounting substrate 35 form two circuit lines A and B shown in FIG. 4A, and electric current flows through the two circuit lines A and B in the direction shown by the arrows in FIG. 4A. For ease of understanding, the current flow through the circuit line A is indicated by a broken line, and the current flow through the circuit line B is indicated by a solid line.

First, the circuit line A is described. The electric current supplied to the wiring pattern 31a flows through the connecting wiring pattern 29 of the LED 20 indicated by I to the wiring pattern 32b. Then, the current flows from the wiring pattern 32b to the LED element 22 of the LED 20 indicated by II, and the LED 20 indicated by II is turned on, as shown in FIG. 4B. The current having passed through this LED element 22 flows to the wiring pattern 31c. Then, the current flows through a path similar to that described above, and the LED 20 indicated by IV is turned on. In the circuit line A, the LEDs 20 indicated by II and IV are turned on (see FIG. 4B).

Next, a description is given of the circuit line B. The electric current supplied to the wiring pattern 32a flows to the LED element 22 of the LED 20 indicated by I, and this LED 20 is turned on. The current having passed through this LED element 22 flows to the wiring pattern 31b, passes through the wiring pattern 31b and the connecting wiring pattern 29 of the LED 20 indicated by II, and flows to the wiring pattern 32c. Then, the current flows through a path similar to that described above, and the LED 20 indicated by III is turned on. In the circuit line B, the LEDs 20 indicated by I and III are turned on (see FIG. 4B).

When current is supplied to both the circuit lines A and B, all the LEDs 20 are turned on. When current is supplied to one of the circuit lines A and B, half of the LEDs 20 are turned on. In this manner, the LEDs 20 can be selectively turned on.

In the LED 20 of the first embodiment, the connecting wiring pattern 29 and the wiring patterns 31 and 32 form one wiring pattern. This wiring pattern is formed within an area not exceeding the vertical width of the plurality of LEDs 20 arranged in a row. Therefore, in contrast to the above conventional technology, it is not necessary to provide the wiring patterns on both edge sides of the upper surface of the substrate. In addition to this, the vertical width of the substrate (the width in the vertical direction in FIG. 1A) can be reduced to the minimum necessary width, and the vertical width of the plurality of LEDs 20 arranged in a row can be reduced. In this manner, the LEDs 20 can be reduced in size.

The overall length of the plurality of LEDs arranged in a row is substantially determined by the length of the wiring patterns 31 and 32 arranged in parallel with each other. However, since the wiring patterns 31 and 32 can be formed to have a simple shape, the length thereof can also be reduced to the minimum necessary length. Accordingly, the horizontal length required for mounting a predetermined number of LEDs can be reduced, and therefore, electronic devices and lighting apparatuses in which the mounting substrate having the LEDs mounted thereon is installed can be reduced in lateral dimension.

Each of the LEDs 20 is secured to the wiring patterns 31 and 32 at four corners, i.e., the pair of lower electrodes 23 and 24 and the pair of dummy or connecting electrodes 27 and 28. Therefore, the securing power is higher in the above case than in the case where each LED 20 is secured at two points (the pair of lower electrodes 23 and 24).

Moreover, the following advantage can be obtained. For example, LED elements may have variations in luminous intensity. In such a case, LEDs having the same emission color are divided into a high-luminous intensity group and a low-luminous intensity group, and the grouped LEDs are disposed separately in the circuit lines A and B. The luminous intensity of the LEDs in the low-luminous intensity line can be increased to the same level as that of the LEDs in the high-luminous intensity line by supplying a higher electric current to the low-luminous intensity line, whereby the luminous intensities can be adjusted. In this manner, uniform brightness can be obtained.

No particular limitation is imposed on the emission color of the LED element 22. The type of the LED element 22 may be determined based on the design specifications.

In the present embodiment, the LED element 22 includes the p-electrode portion and the n-electrode portion on the upper surface thereof. An LED 40 shown in FIG. 5 can include an LED element 42 having electrode portions on its upper and lower surfaces. When such an LED element is used, similar operational advantages can be obtained.

Figure 5:
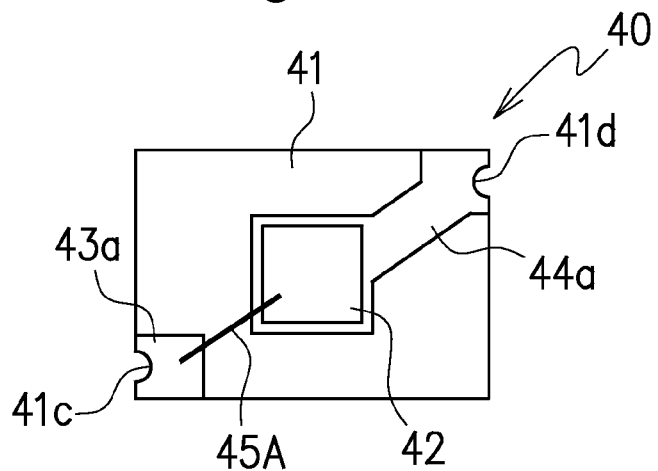
FIG. 5 is a plan view illustrating a modification of electrical connection to the LED element in the first embodiment.

The LED 40 shown in FIG. 5 is a modification of the LED 20 of the first embodiment. The LED element 42 of this LED 40 includes, on the upper surface side, a p-electrode portion connected to a p-type semiconductor layer and, on the lower surface side, an n-electrode portion connected to an n-type semiconductor layer. The p-electrode portion on the upper surface side is connected to an upper electrode 43a functioning as an anode electrode through a bonding wire 45A. The n-electrode portion on the lower surface side is connected to an upper electrode 44a functioning as a cathode electrode through a conductive adhesive.

The upper electrode 44a functioning as the cathode electrode extends from a corner having a through-hole 41d formed thereat to the central portion of a substrate 41 on which the LED element 42 is mounted. The upper electrode 44a is electrically connected to the n-electrode portion provided on the lower surface side of the LED element 42.

When a predetermined electric current is supplied from the upper electrode 43a to the LED element 42 through the bonding wire 45A, the LED element 42 emits light. The current flows from the LED element 42 to the upper electrode 44a through the n-electrode portion.

The pair of lower electrodes, the pair of connecting electrodes, and the connecting wiring pattern for connecting the pair of connecting electrodes, which are provided on the lower surface side of the substrate 41, have the same structures as those shown in FIG. 1C, and accordingly, the description thereof will be omitted.

Figure 6A:
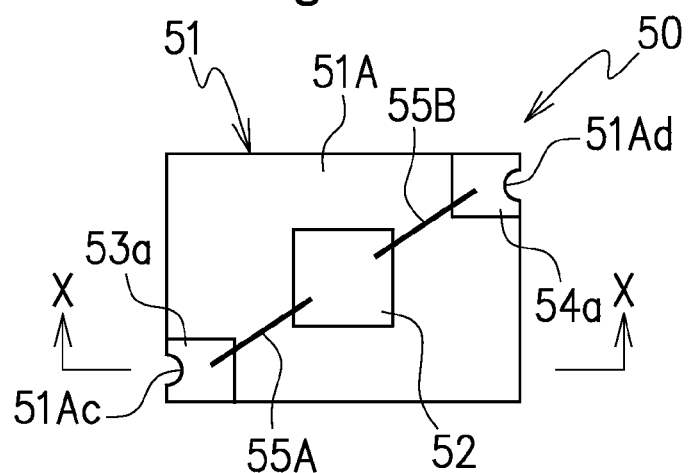
FIG. 6A is a plan view of an LED according to a second embodiment of the present invention.
Figure 6B:
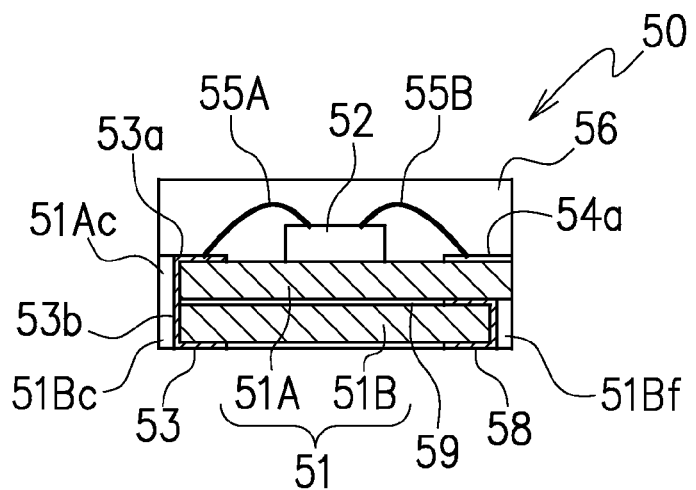
FIG. 6B is a cross-sectional view taken along line X-X in FIG. 6A.

FIGS. 6A to 6D show an LED according to a second embodiment of the present invention. As shown in FIG. 6B, the LED 50 according to the present embodiment is different from the LED 20 of the first embodiment and characterized in that the substrate is a stacked substrate 51 formed by stacking an upper substrate 51A and a lower substrate 51B and that a connecting wiring pattern 59 is provided between the upper substrate 51A and the lower substrate 51B.

Figure 6C:
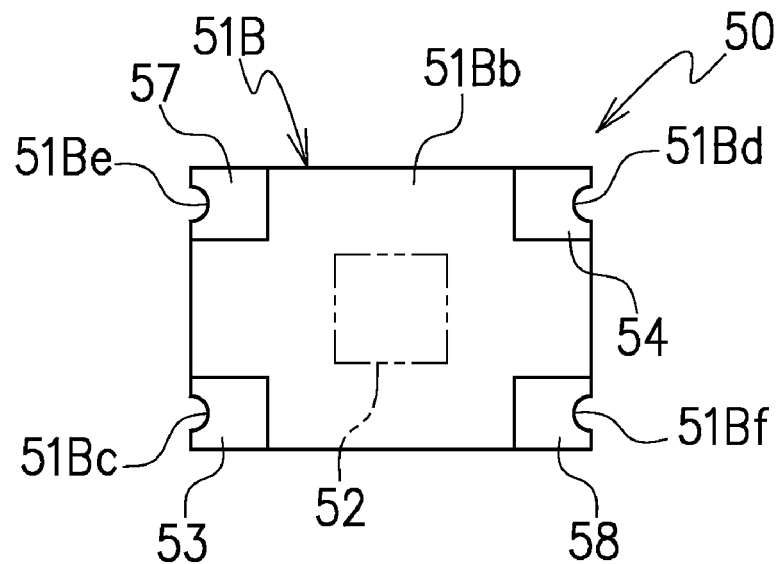
FIG. 6C is a transparent view from the upper side, illustrating the lower surface of the LED shown in FIG. 6A.
Figure 6D:
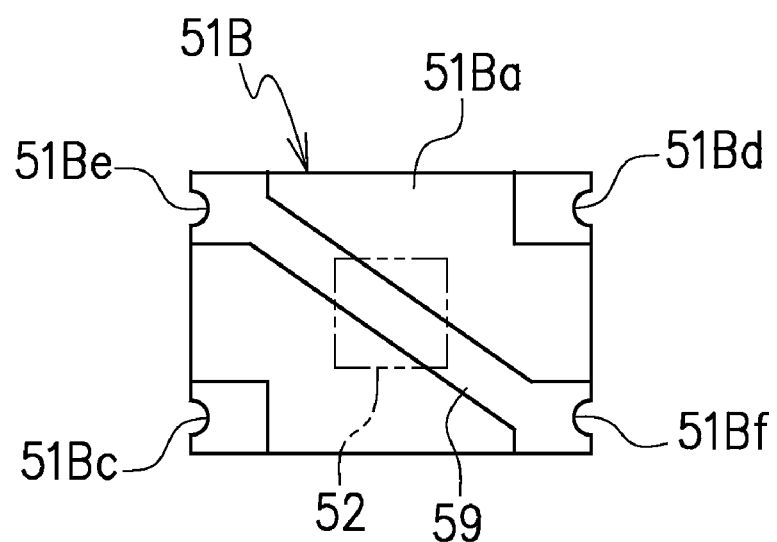
FIG. 6D is a plan view of the lower substrate shown in FIG. 6B.

As shown in FIG. 6A, the upper substrate 51A has through-holes 51Ac and 51Ad at first two diagonally opposite corners, and upper electrodes 53a and 54a are provided around the through-holes 51Ac and 51Ad so as to be electrically connected thereto. As shown in FIG. 6C, the lower substrate 51B is the same size as the upper substrate 51A and has through-holes 51Bc and 51Bd at first two diagonally opposite corners and through-holes 51Be and 51Bf at second two diagonally opposite corners. As shown in FIG. 6B, when the upper substrate 51A and the lower substrate 51B are stacked together, the through-hole 51Ac of the upper substrate 51A and the through-hole 51Bc of the lower substrate 51B are located at the same position and align with each other. Similarly, the through-hole 51Ad of the upper substrate 51A and the through-hole 51Bd of the lower substrate 51B are located at the same position and align with each other.

As shown in FIG. 6C, the lower substrate 51B includes on its lower surface 51Bb a pair of lower electrodes 53 and 54 provided around the through-holes 51Bc and 51Bd and a pair of connecting electrodes 57 and 58 provided around the through-holes 51Be and 51Bf. These connecting electrodes 57 and 58 are connected to the connecting wiring pattern 59 on the upper surface 51Ba side through the through-holes 51Be and 51Bf. When the upper substrate 51A and the lower substrate 51B are stacked with a non-conductive adhesive interposed therebetween, the connecting wiring pattern 59 is disposed between the upper substrate 51A and the lower substrate 51B.

In the stacked substrate 51, the through-hole 51Ac of the upper substrate 51A and the through-hole 51Bc of the lower substrate 51B align with each other, and a through-hole electrode pattern 53b is provided on the inner surfaces of the through-holes 51Ac and 51Bc. Similarly, a through-hole electrode pattern (not shown) is provided on the inner surfaces of the through-hole 51Ad and the through-hole 51Bd. In this manner, the lower electrode 53, the through-hole electrode pattern 53b, and the upper electrode 53a are electrically connected to one another, and the lower electrode 54, the non-illustrated through-hole electrode pattern, and the upper electrode 54a are electrically connected to one another.

An LED element 52 having a p-electrode portion and an n-electrode portion is mounted on the upper surface side of the stacked substrate 51 with an adhesive therebetween. The p-electrode portion of the LED element 52 and the upper electrode 53a are connected to each other through a bonding wire 55A, and the n-electrode portion of the LED element 52 and the upper electrode 54a are connected to each other through a bonding wire 55B. A light-transmitting sealing resin 56 for protecting the LED element 52, the bonding wires 55A and 55B, the upper electrodes 53a and 54a, and the like is provided on the upper surface side of the stacked substrate 51.

In the LED 50 configured as above, when a predetermined electric current is supplied to the lower electrode 53, the current flows through the through-hole electrode pattern 53b, the upper electrode 53a, and the bonding wire 55A to the LED element 52, and the LED 50 emits light. Then, the current flows from the LED element 52 to the lower electrode 54 through the bonding wire 55B, the upper electrode 54a and the non-illustrated through-hole electrode pattern. The flow path of the current is the same as that in the LED 20 of the first embodiment.

The connecting electrodes 57 and 58 and the connecting wiring pattern 59 do not have any influence on the light emission of the LED element 52. This is because the current flowing into the connecting electrode 57 from a wiring pattern of a mounting substrate flows through the connecting wiring pattern 59 to the connecting electrode 58 and then flows to the next wiring pattern of the mounting substrate.

The mounting substrate for mounting the above-described LED 50 thereon may have the same structure as that of the mounting substrate 35 shown in FIG. 2 and described in the first embodiment. Since the mounting structure of the LED 50 is substantially the same as that described in FIG. 3, the detailed description will be omitted. By horizontally arranging the LEDs in a row as shown in FIG. 3, the length and width of the mounted LEDs can be minimized. Moreover, the same advantages as those in the first embodiment can be obtained.

In the present embodiment, since the connecting wiring pattern 59 is disposed between the layers of the stacked substrate 51, only the pair of lower electrodes 53 and 54 and the pair of connecting electrodes 57 and 58 are provided on the lower surface of the stacked substrate 51. Therefore, the electrodes are spaced apart with ample distance therebetween, so that a short-circuit between the electrodes is less likely to occur when the LEDs are mounted on the mounting substrate.

Since only one connecting wiring pattern 59 is provided between the layers of the stacked substrate 51, the connecting wiring pattern 59 can have a large width. If the pattern width of the connecting wiring pattern 59 is increased in an area just below the LED element 52 mounted on the central portion of the substrate, the heat generated by the LED element 52 can be efficiently transferred to the connecting wiring pattern 59 and can be dissipated through the connecting wiring pattern 59 and the connected wiring patterns of the mounting substrate. With the above configuration, the heat dissipation characteristics can be effectively improved.

Figure 7A:
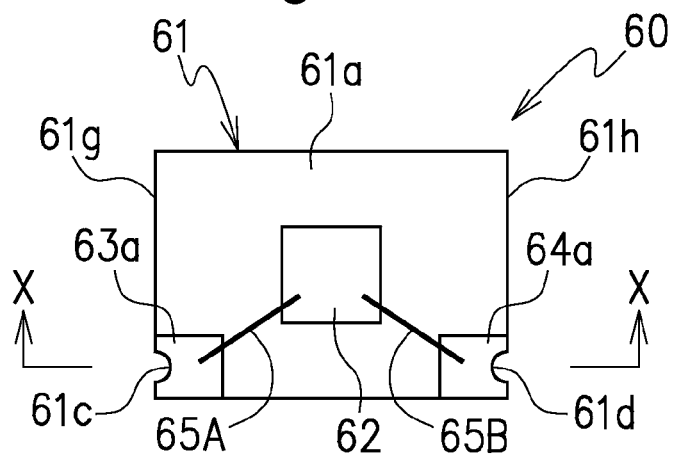
FIG. 7A is a plan view of an LED according to a third embodiment of the present invention.
Figure 7B:
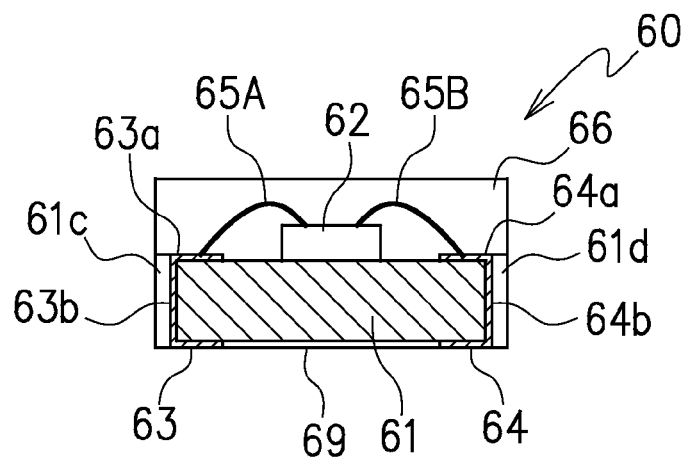
FIG. 7B is a cross-sectional view taken along line X-X in FIG. 7A.
Figure 7C:
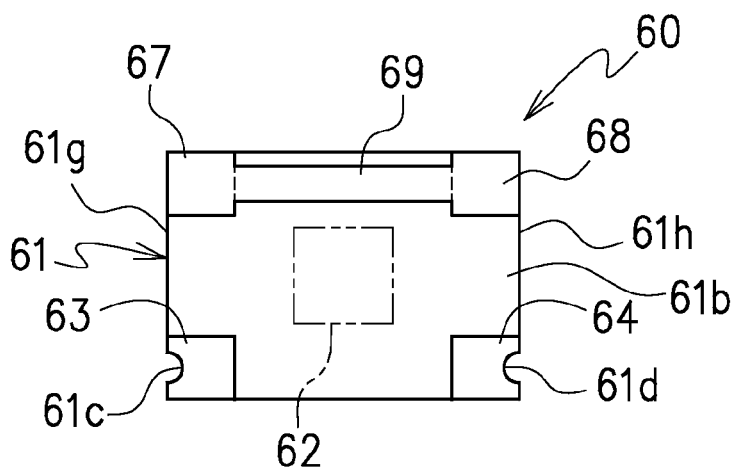
FIG. 7C is a transparent view from the upper side, illustrating the lower surface of the LED shown in FIG. 7A.
Figure 8:
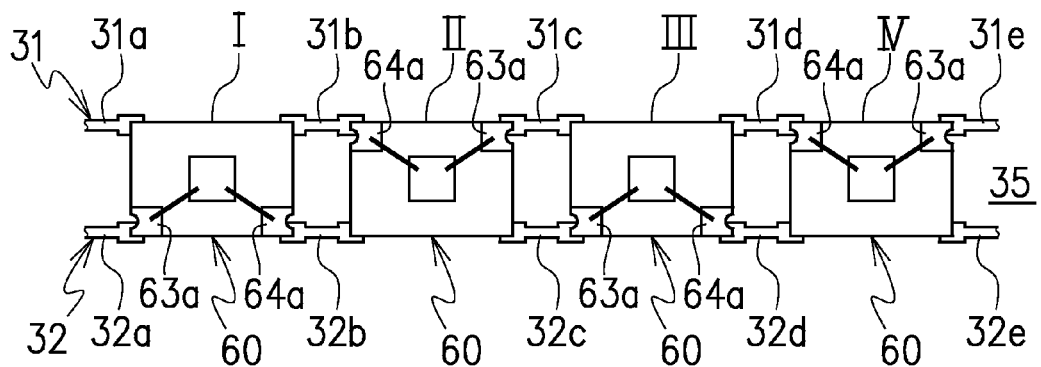
FIG. 8 is a plan view illustrating the mounted state of the LEDs according to the third embodiment.

FIGS. 7 to 9 show an LED according to a third embodiment of the present invention. The LED 60 according to the present embodiment is characterized in that, as shown in FIG. 7C, a pair of lower electrodes 63 and 64 for providing electrical continuity with an LED element 62 are provided near the adjacent corners of the lower surface 61b of a substrate 61. More specifically, the lower electrodes 63 and 64 are provided near the adjacent corners on the same side (the lower side in FIG. 7C) of opposed edges 61g and 61h. Through-holes 61c and 61d are provided at these corners, and through-hole electrode patterns 63b and 64b are provided on the inner surfaces of the through-holes 61c and 61d. Upper electrodes 63a and 64a connected to the through-hole electrode patterns 63b and 64b are provided on the upper surface 61a side of the substrate 61. The upper electrodes 63a and 64a are connected to the LED element 62 through bonding wires 65A and 65B.

In the preceding embodiment, the electrodes and the electrode patterns are provided at two diagonally opposite corners. The present embodiment is different from the preceding embodiment in that the pair of lower electrodes 63 and 64 and the pair of upper electrodes 63a and 64a are provided near the adjacent corners on the same side (the lower side) of the opposed edges 61g and 61h.

Another feature of the LED 60 is that a pair of connecting electrodes 67 and 68 are provided at two other adjacent corners as viewed in FIG. 7C of the substrate 61 and that a connecting wiring pattern 69 for connecting the connecting electrodes 67 and 68 is provided substantially parallel to the upper edge of the substrate 61, as shown in FIG. 7C.

The configuration of the LED 60 of the third embodiment will be described in more detail. As shown in FIGS. 7A and 7B, the LED 60 includes the LED element 62 mounted on the substantially central portion of the upper surface 61a of the substrate 61 with an adhesive interposed therebetween. The LED element 62 includes two electrode portions on its upper surface side. More specifically, the LED element 62 includes on the upper surface side a p-electrode portion connected to a p-type semiconductor layer and an n-electrode portion connected to an n-type semiconductor layer.

The substrate 61 includes the through-holes 61c and 61d provided near the adjacent corners on the same side of the opposed edges 61g and 61h. The pair of lower electrodes 63 and 64 on the lower surface 61b side of the substrate 61 are provided around the through-holes 61c and 61d (see FIG. 7C). The pair of lower electrodes 63 and 64 are electrically continuous with the upper electrodes 63a and 64a provided on the upper surface 61a of the substrate 61 through the through-hole electrode patterns 63b and 64b provided on the inner surfaces of the through-holes 61c and 61d.

The upper electrode 63a serves as an anode electrode and is connected to the p-electrode portion of the LED element 62 through the bonding wire 65A. The n-electrode portion of the LED element 62 is connected to the upper electrode 64a serving as a cathode electrode through the bonding wire 65B. When a predetermined electric current is supplied from the upper electrode 63a functioning as the anode electrode to the LED element 62 through the bonding wire 65A, the LED 60 emits light. The current flows from the LED element 62 to the upper electrode 64a functioning as the cathode electrode through the bonding wire 65B.

The structure on the lower surface 61b side of the substrate 61 is as described above and is shown in FIG. 7C. The pair of connecting electrodes 67 and 68 provided at the adjacent corners of the substrate 61 are connected by the connecting wiring pattern 69. In addition, a light-transmitting sealing resin 66 for protecting the LED element 62, the bonding wires 65A and 65B, the upper electrodes 63a and 64a, and the like, is provided on the upper surface 61a side of the substrate 61.

In the LED 60 configured as above, when an electric current flows from a wiring pattern of a mounting substrate to the LED element 62 through the lower electrode 63, the LED 60 emits light. Then, the current flows from the LED element 62 to the lower electrode 64. An electric current supplied from a wiring pattern of the mounting substrate to the connecting electrode 67 flows to the connecting electrode 68 through the connecting wiring pattern 69.

The mounting substrate for mounting the LEDs 60 thereon may have the same structure as that of the mounting substrate 35 shown in FIG. 2 and described in the first embodiment. FIG. 8 shows the connection state of the LEDs 60 connected to the wiring patterns 31 and 32 of the mounting substrate 35.

In the LED 60 indicated by I, the connecting electrodes 67 and 68 are connected to wiring patterns 31a and 31b, respectively, on the wiring pattern 31 side. The lower electrodes 63 and 64 are connected to wiring patterns 32a and 32b, respectively, on the wiring pattern 32 side.

In the LED 60 indicated by II, the lower electrodes 64 and 63 are connected to wiring patterns 31b and 31c, respectively, on the wiring pattern 31 side. The connecting electrodes 68 and 67 are connected to wiring patterns 32b and 32c, respectively, on the wiring pattern 32 side. The LED 60 indicated by III is connected in a manner similar to that of the LED 60 indicated by I, and the LED 60 indicated by IV is connected in a manner similar to that of the LED 60 indicated by II. It should be noted that the plurality of LEDs 60 are arranged in an array in an alternately reversed manner.

Figure 9A:
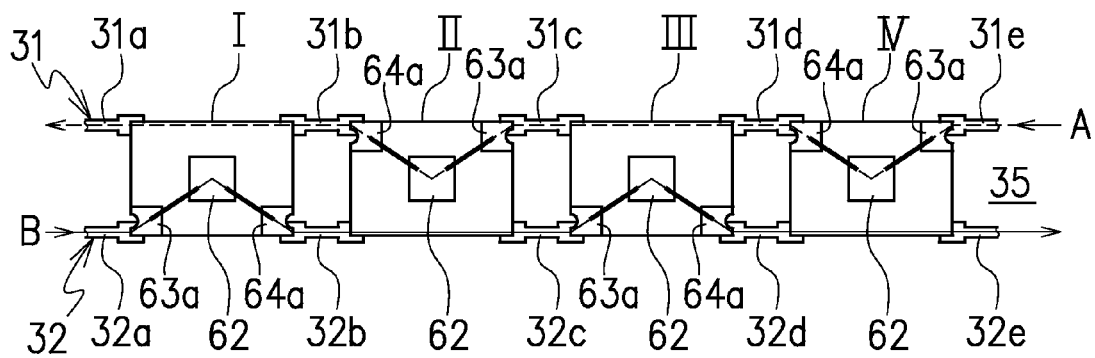
FIG. 9A is a diagram describing the flow of current through the mounted LEDs.
Figure 9B:
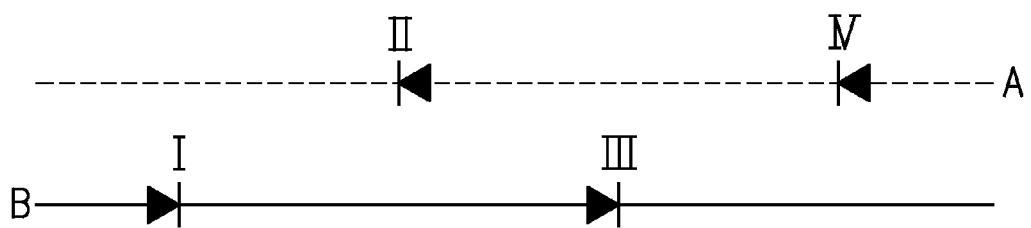
FIG. 9B is a circuit diagram illustrating the ON-OFF states of the mounted LEDs.

FIGS. 9A and 9B are used to illustrate the operational advantage of this mounting structure. The wiring patterns 31 and 32 of the mounting substrate 35 form two circuit lines A and B, and electric current flows through the circuit lines A and B in directions shown by the arrows in FIG. 9A. For ease of understanding, the current flowing through the circuit line A to the left in the figure is indicated by a broken line, and the current flowing through the circuit line B to the right in the figure is indicated by a solid line.

First, the circuit line A is described. The current passing through the circuit line A flows from a wiring pattern 31e to the LED element 62 indicated by IV through the lower electrode 63 thereof, and this LED 60 thereby emits light. The current flows from this LED 60 through the lower electrode 64 thereof to the next wiring pattern 31d. The current supplied to the wiring pattern 31d flows to the wiring pattern 31c through the connecting electrode 68, the connecting wiring pattern 69, and the connecting electrode 67 of the LED 60 indicated by III. The current then flows to the LED elements 62 indicated by II and I in a manner similar to that described above, and the current flowing through the circuit line A causes the LEDs 60 indicated by II and IV to be turned on (see FIG. 9B).

A description will now be given of the circuit line B. The current passing through the circuit line B flows from the wiring pattern 32a to the LED element 62 indicated by I through the lower electrode 63 thereof, and this LED 60 thereby emits light. Then, the current flows from the LED element 62 through the lower electrode 64 thereof to the next wiring pattern 32b. The current supplied to the wiring pattern 32b flows through the connecting electrode 68, the connecting wiring pattern 69, and the connecting electrode 67 of the LED 60 indicated by II to the wiring pattern 32c. The current then flows to the LED elements 62 indicated by III and IV in a manner similar to that described above, and the current flowing through the circuit line B causes the LEDs 60 indicated by I and III to be turned on (see FIG. 9B).

As described above, when current is supplied to only the circuit line A, the LEDs 60 indicated by II and IV are turned on. When current is supplied to only the circuit line B, the LEDs 60 indicated by I and III are turned on. When current is supplied to both the circuit lines A and B, all the LEDs 60 indicated by I to IV are turned on. In this manner, the LEDs 60 can be selectively turned on.

In the mounting structure of the LEDs 60 shown in FIG. 8, the LEDs 60 are arranged such that the vertical orientation of every other LED is reversed. However, different arrangement structures may be used. For example, the LEDs 60 may be arranged such that the orientation of every other two or three LEDs is reversed. The brightness of the lighting apparatus can be controlled by changing the arrangement structure.

With the LEDs 60 of the present embodiment, the connecting wiring patterns 69 and the wiring patterns 31 and 32 of the mounting substrate 35 form one wiring pattern for turning on the LEDs 60. This wiring pattern is formed within an area not exceeding the vertical width of the array of the plurality of horizontally arranged LEDs 60. In this manner, as in the preceding embodiment, the vertical and horizontal widths of the diode array can be reduced to the minimum necessary values, so that the size reduction can be achieved.

In the LED 60 of the present embodiment, a single-layer substrate is used as the substrate 61, and the dummy connecting wiring pattern 69 is provided on the lower surface 61b of the substrate 61. However, a double-layer stacked substrate may be used as in the second embodiment, and the connecting wiring pattern may be provided between the layers of the stacked substrate.

The LED element 62 used in the present embodiment has two electrode portions (being the p-electrode portion and n-electrode portion) on its upper surface side. However, when an LED element 72 shown in FIG. 10 is used, an operational advantage similar to that in the present embodiment can be obtained.

Figure 10:
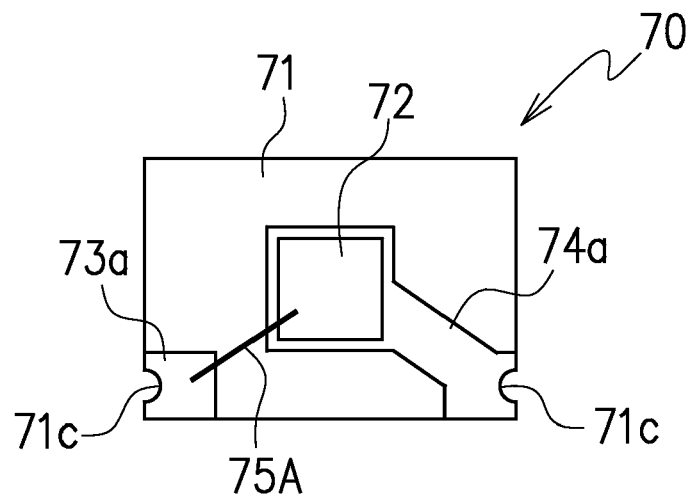
FIG. 10 is a plan view illustrating a modification of electrical connection to the LED element in the third embodiment.

FIG. 10 shows a modification of the LED 60 of the third embodiment. The LED element 72 of an LED 70 includes, on the upper surface side, a p-electrode portion connected to a p-type semiconductor layer and, on the lower surface side, an n-electrode portion connected to an n-type semiconductor layer. The p-electrode portion on the upper surface side is connected to an upper electrode 73a functioning as an anode electrode through a bonding wire 75A. The n-electrode portion on the lower surface side is connected to an upper electrode 74a functioning as a cathode electrode with a conductive adhesive therebetween.

The upper electrode 74a extends from a corner having a through-hole 71d formed thereat to the central portion of a substrate 71 on which the LED element 72 is mounted. The upper electrode 74a is electrically connected to the n-electrode portion provided on the lower surface side of the LED element 72.

When a predetermined electric current flows from the upper electrode 73a to the LED element 72 through the bonding wire 75A, the LED element 72 emits light. The current then flows from the LED element 72 to the upper electrode 74a.

A pair of lower electrodes, a pair of connecting electrodes, and a connecting wiring pattern for connecting the pair of connecting electrodes, which are provided on the lower surface side of the substrate 71, have the same structures as those shown in FIG. 7C, and the description thereof will be omitted.

Figure 11A:
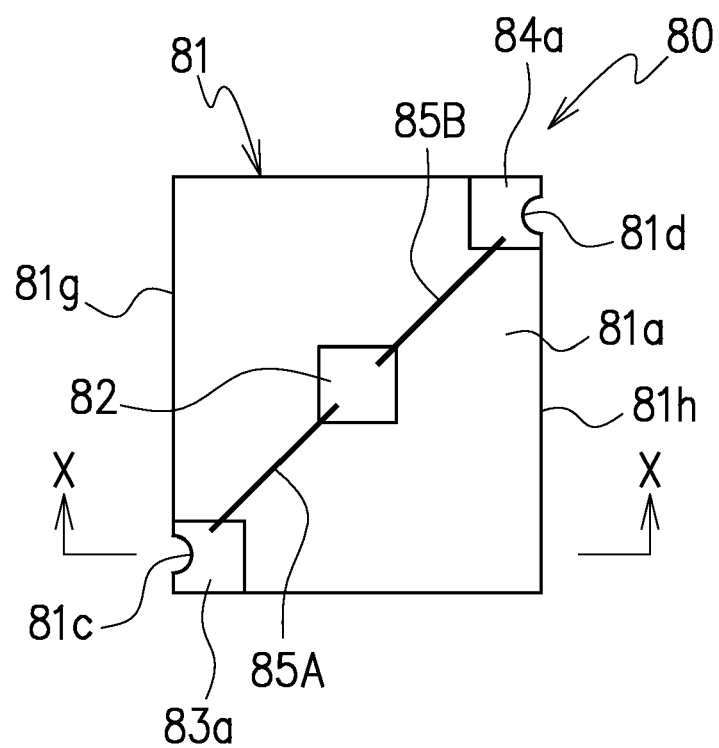
FIG. 11A is a plan view of an LED according to a fourth embodiment of the present invention.
Figure 11B:
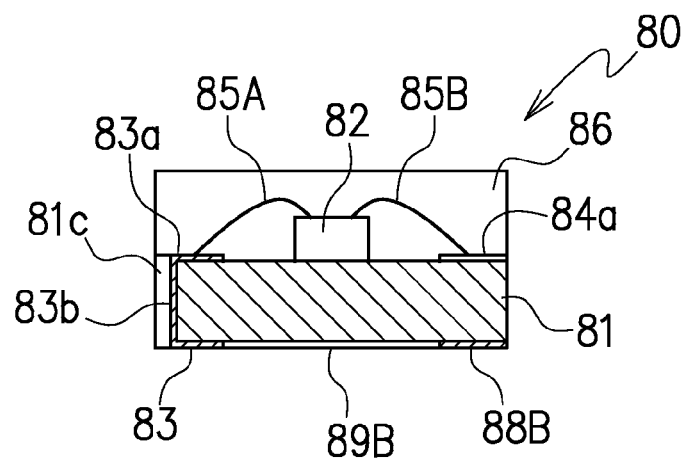
FIG. 11B is a cross-sectional view taken along line X-X in FIG. 11A.

FIGS. 11A to 14B show an LED according to a fourth embodiment of the present invention. As shown in FIGS. 11A and 11B, the LED 80 of the present embodiment includes a single-layer substrate 81 and one LED element 82 mounted on the upper surface 81a of the substrate 81. The substrate 81 includes, on the upper surface 81a side, an upper electrode 83a functioning as an anode electrode and an upper electrode 84a functioning as a cathode electrode, and the upper electrodes 83a and 84a are provided at first two diagonally opposite corners of the substrate 81. The LED element 82 is connected to the upper electrodes 83a and 84a through bonding wires 85A and 85B. Through-holes 81c and 81d are formed at the first corners of the substrate 81 at which the upper electrodes 83a and 84a are provided, and a pair of lower electrodes 83 and 84 are provided on the lower surface 81b side of the substrate 81 at positions corresponding to the through-holes 81c and 81d (see FIG. 11C). A through-hole electrode pattern 83b for electrically connecting the upper electrode 83a to the lower electrode 83 is provided on the inner surface of the through-hole 81c. Similarly, a through-hole electrode pattern (not shown) for electrically connecting the upper electrode 84a to the lower electrode 84 is provided on the inner surface of the through-hole 81d. A light-transmitting sealing resin 86 for protecting the LED element 82, the bonding wires 85A and 85B, the upper electrodes 83a and 84a, and the like, is provided on the upper surface 81a side of the substrate 81.

Figure 11C:
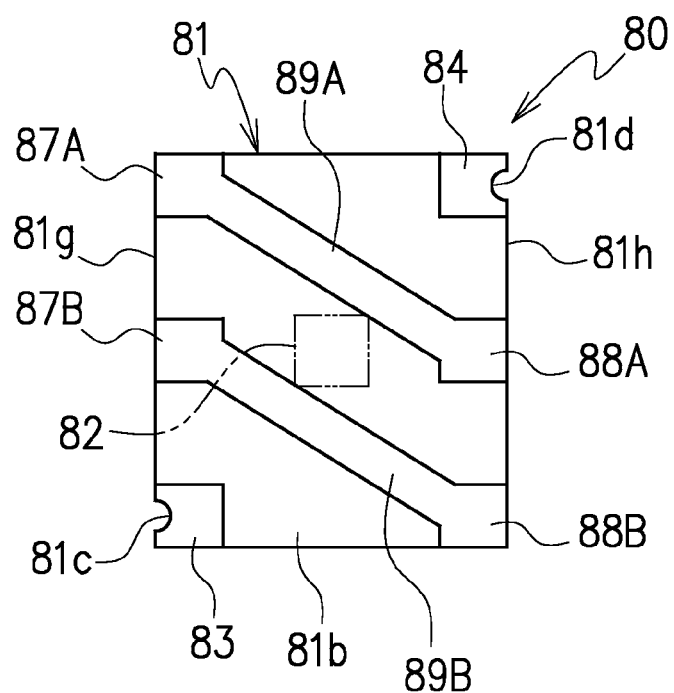
FIG. 11C is a transparent view from the upper side, illustrating the lower surface of the LED shown in FIG. 11A.

As shown in FIG. 11C, connecting electrodes 87A, 87B, 88A, and 88B are formed on the lower surface 81b of the substrate 81 so as to form electrode pairs. These connecting electrodes are provided at positions along two opposed edges 81g and 81h in which the through-holes 81c and 81d are provided. More specifically, the connecting electrodes 87A and 88A are paired, and the connecting electrodes 87B and 88B are paired. The paired connecting electrodes 87A and 88A are connected to each other through a connecting wiring pattern 89A, and the paired connecting electrodes 87B and 88B are connected to each other through a connecting wiring pattern 89B. The connecting wiring patterns 89A and 89B are spaced apart from each other so as not to intersect or come into contact with each other.

The two connecting electrodes 87A and 87B and the lower electrode 83 provided on the edge 81g side are evenly spaced apart from each other. Similarly, the two connecting electrodes 88A and 88B and the lower electrode 84 provided on the edge 81h side are evenly spaced apart from each other.

As shown in FIG. 12, the LEDs 80 configured as above are mounted on a mounting substrate 95 including three rows of wiring patterns 91, 92, and 93 arranged at predetermined intervals. The wiring patterns 91 include wiring patterns 91a, 91b, 91c, 91d, 91e, and 91f, which are arranged at predetermined intervals in the horizontal direction in the figure. The wiring patterns 92 include wiring patterns 92a, 92b, 92c, 92d, 92e, and 92f, which are arranged at predetermined intervals in the horizontal direction in the figure. The wiring patterns 93 include wiring patterns 93a, 93b, 93c, 93d, 93e, and 93f, which are arranged at predetermined intervals in the horizontal direction in the figure. The three rows of wiring patterns 91, 92, and 93 are arranged in parallel to one another at regular intervals in the vertical direction.

The spacing between the wiring patterns 91, 92, and 93 is the same as the spacing between the connecting electrodes and lower electrodes evenly spaced apart from each other near the edges 81g and 81h of the LED 80. Since the connecting electrodes and the lower electrode are evenly spaced apart from each other, no narrow portion is formed. Therefore, when the LEDs 80 are mounted on the mounting substrate 95, the risk of short-circuits between the electrodes and between the electrodes and connecting wiring patterns caused by excessive solder can be reduced.

FIG. 13 shows the mounting structure of the LEDs 80 mounted on the mounting substrate 95. In this case, the connecting electrodes 87A of the LEDs 80 shown in FIG. 11C are connected to the right ends of the wiring patterns 91, the connecting electrodes 87B are connected to the right ends of the wiring patterns 92, and the lower electrodes 83 are connected to the right ends of the wiring patterns 93. The lower electrodes 84 of the LEDs 80 shown in FIG. 11C are connected to the left ends of the wiring patterns 91, the connecting electrodes 88A are connected to the left ends of the wiring patterns 92, and the connecting electrodes 88B are connected to the left ends of the wiring patterns 93. In FIG. 13, the LEDs 80 indicated by I to V are mounted on the substrate in the connection manner described above and are arranged in a horizontal row.

FIGS. 14A and 14B are used to illustrate the operational advantage of this mounting structure. As shown in FIG. 14A, the wiring patterns 91, 92, and 93 of the mounting substrate 95 form three circuit lines A, B, and C through which electric current flows. For the purpose of facilitating an understanding of the current flowing through the circuit lines A, B, and C, the circuit line A is indicated by a broken line, the circuit line B is indicated by an alternate long and short dash line, and the circuit line C is indicated by a solid line.

First, the circuit line A is described. The current supplied to the wiring pattern 91a flows through the connecting wiring pattern 89A of the LED 80 indicated by I to the wiring pattern 92b. Then, the current flows through the connecting wiring pattern 89B of the LED 80 indicated by II to the wiring pattern 93c and then passes through the LED element 82 of the LED 80 indicated by III, and this LED 80 is thereby turned on (see FIG. 14B). The current flows from this LED element 82 to the wiring pattern 91d. Then, the current flows through a path similar to that described above.

Next, the circuit line B is described. The current supplied to the wiring pattern 92a flows through the connecting wiring pattern 89B of the LED 80 indicated by I to the wiring pattern 93b. Then, the current flows to the LED element 82 of the LED 80 indicated by II, and this LED 80 is thereby turned on. The current flows from this LED element 82 to the wiring pattern 91c. Subsequently, the current flows through the connecting wiring pattern 89A of the LED indicated by III to the wiring pattern 92d. Then, the current flows through a path similar to that described above. In this manner, current flowing through the circuit line B causes the LEDs 80 indicated by II and V to be turned on (see FIG. 14B).

Next, the circuit line C is described. The current supplied to the wiring pattern 93a flows to the LED element 82 of the LED 80 indicated by I to turn on this LED 80 and then flows to the wiring pattern 91b. This current flows through the connecting wiring pattern 89A of the LED 80 indicated by II to the wiring pattern 92c. Subsequently, the current flows through the connecting wiring pattern 89B of the LED 80 indicated by III to the wiring pattern 93d. Then, the current flows through a path similar to that described above. In this manner, the current flowing through the circuit line C causes the LEDs 80 indicated by I and IV to be turned on (see FIG. 14B).

As described above, the LEDs 80 can be selectively turned on by selecting any of the circuit lines A, B, and C. In other words, since the selection can be made from the three circuit lines, the LEDs can be selectively turned on in various different manners. Therefore, the brightness of the lighting apparatus can be controlled over a wide range.

In the fourth embodiment, two connecting wiring patterns and three rows of wiring patterns are used. However, the numbers of connecting wiring patterns and wiring patterns can be increased. In such a case, the range of brightness control can be further extended.

If one of the wiring patterns is broken, the break does not affect the other wiring patterns, so that not all the LEDs are turned off. For example, if a wiring pattern in the circuit line A is broken, the break does not affect the circuit lines B and C, so that the LEDs in these circuit lines remain turned on.

Since three circuit lines are provided, red, green, and blue LEDs can be disposed in different circuit lines for different emission colors. In this case, white light can be obtained by simultaneously turning on these LEDs. The materials for diodes are different for different emission colors, and the diode characteristics, such as the threshold voltage (Vf), depend on the material used. Therefore, these characteristics must be controlled for each color. However, since LEDs of different emission colors can be disposed in different circuit lines, the LEDs in different circuit lines can be separately controlled. Therefore, a simple and non-complicated control circuit can be used, and also a simple and non-complicated wiring circuit can be used. This allows narrow-pitch mounting.

When LEDs of the same color are used, the LEDs having different luminous intensities may be grouped into three classes based on the luminous intensity, and the LEDs in different classes may be disposed in different circuit lines. For example, high-luminous intensity LEDs may be disposed in the circuit line A, medium-luminous intensity LEDs may be disposed in the circuit line B, and low-luminous intensity LEDs may be disposed in the circuit line C. In this manner, uniform light can be emitted from the LEDs in each circuit line.

As described in the preceding embodiment, the luminous intensity can be controlled for each circuit line. By adjusting the luminous intensities of different circuit lines to substantially the same level, substantially the same brightness can be obtained.

In the LED 80 of the present embodiment, the single-layer substrate 81 is used, and two connecting wiring patterns 89A and 89B are provided on the rear face of the substrate. However, as the number of connecting wiring patterns increases, the risk increases of contact short-circuits between the electrodes and between the electrodes and connecting wiring patterns caused by excessive solder formed when the LED 80 is soldered to the mounting substrate 95. To avoid such a risk, the connecting wiring patterns may be provided between two stacked substrates, as in the second embodiment. It is also effective to provide the connecting wiring patterns in a separate manner on the lower surface of one of the stacked substrates and between the stacked substrates.

With the above configuration, the wiring circuit pattern can be made very simple. Moreover, the number of wiring patterns can be increased while the vertical width (the width in the vertical direction in FIG. 11A) of the LEDs 80 is suppressed to the minimum necessary width. In addition, the circuit is not complicated, and the manufacturing cost can be reduced.

Figure 15A:
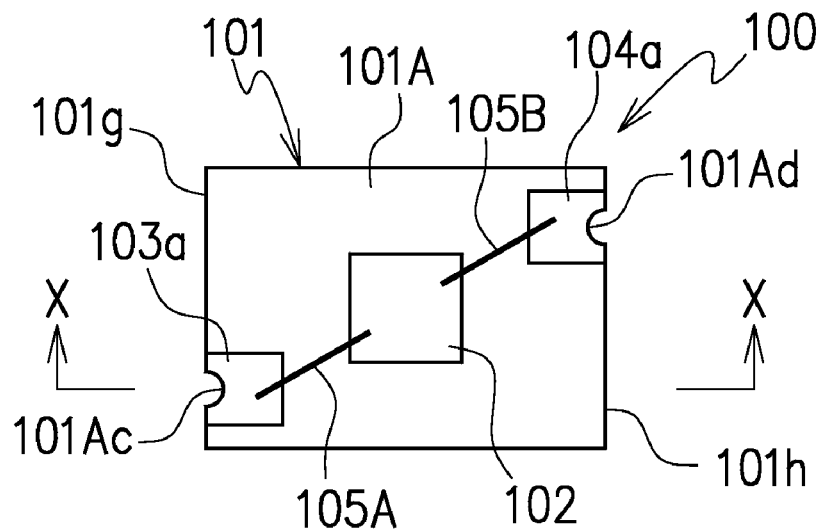
FIG. 15A is a plan view of an LED according to a fifth embodiment of the present invention.
Figure 15B:
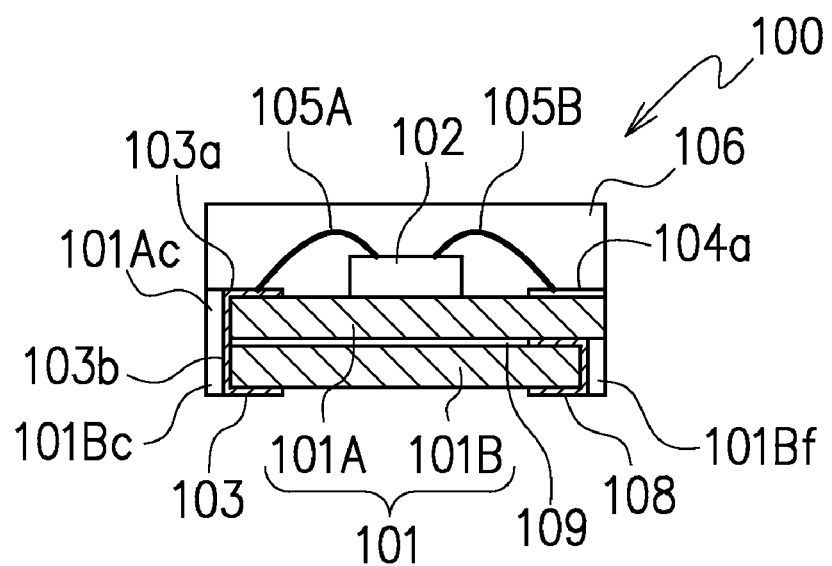
FIG. 15B is a cross-sectional view taken along line X-X in FIG. 15A.

FIGS. 15A to 15D show an LED according to a fifth embodiment of the present invention. As shown in FIG. 15B, the LED 100 includes a stacked substrate 101 produced by stacking an upper substrate 101A and a lower substrate 101B. This structure is substantially the same as the structure in the second embodiment shown in FIG. 6B. This structure is different from the structure of the LED in the second embodiment in that through-holes, a pair of lower electrodes, and a pair of connecting electrodes are provided near the diagonally opposite corners of the stacked substrate 101. Therefore, only the structural differences will be described here.

Figure 15C:
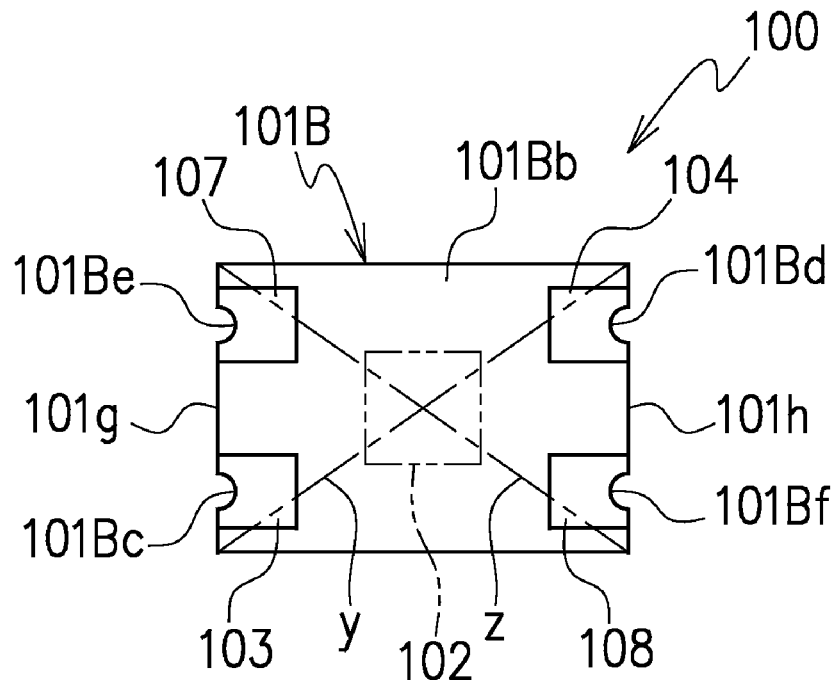
FIG. 15C is a transparent view from the upper side, illustrating the lower surface of the LED shown in FIG. 15A.

The pair of lower electrodes 103 and 104 are provided on the lower surface of the stacked substrate 101, i.e., the lower surface 101Bb of the lower substrate 101B. As shown in FIG. 15C, the lower electrodes 103 and 104 are provided at positions slightly spaced from the corners on a first diagonal line y (indicated by a long and short dash line), i.e., near the corners of the left and right edges 101g and 101h. These lower electrodes 103 and 104 are electrically continuous with an LED element 102 mounted on the stacked substrate 101.

The pair of connecting electrodes 107 and 108 are provided at positions slightly spaced from the corners on a second diagonal line z, i.e., near the corners of the left and right edges 101g and 101h. The connecting electrode 107 and the lower electrode 103 provided near the edge 101g are spaced apart by a predetermined distance, and the lower electrode 104 and the connecting electrode 108 provided near the edge 101h are also spaced apart by a predetermined distance. The predetermined distance refers to a distance sufficient for preventing a short-circuit between the electrodes caused by excessive solder formed when the electrodes are soldered to a mounting substrate.

When the connecting electrodes and the electrodes cannot be provided at the corners on the diagonal lines of a substrate for some reason, these electrodes may be provided at positions slightly spaced from the corners on the diagonal lines as in the present embodiment.

Figure 15D:
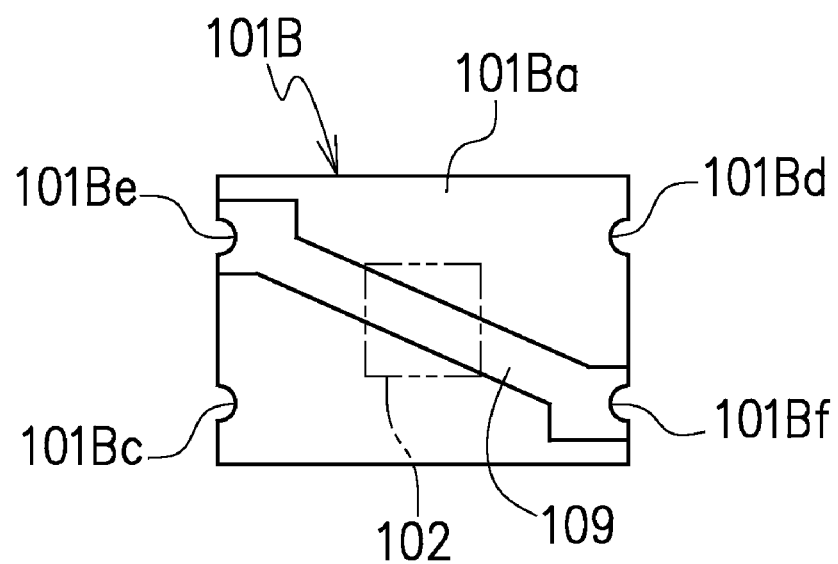
FIG. 15D is a plan view of the lower substrate shown in FIG. 15B.

In the present embodiment, through-holes 101Bc and 101Bd are provided at positions corresponding to the positions of the lower electrodes 103 and 104, and through-holes 101Be and 101Bf are provided at positions corresponding to the positions of the connecting electrodes 107 and 108. As shown in FIG. 15D, a connecting wiring pattern 109 is provided on the upper surface 101Ba of the lower substrate 101B, and the connecting electrodes 107 and 108 are connected to the connecting wiring pattern 109 through the through-holes 101Be and 101Bf.

Through-holes 101Ac and 101Ad are provided in the upper substrate 101A and are located at positions corresponding to the positions of the through-holes 101Bc and 101Bd for the lower electrodes 103 and 104 that are provided in the lower substrate 101B. A through-hole electrode pattern 103b is provided on the inner surfaces of the through-holes 101Ac and 101Bc (a through-hole electrode pattern in the through-holes 101Bd and 101Ad is not shown). An upper electrode 103a is provided on the upper surface of the stacked substrate 101 and is connected to the lower electrode 103 through the through-hole electrode pattern 103b. An upper electrode 104a is provided on the upper surface of the stacked substrate 101 and is connected to the lower electrode 104 in a similar manner.

In the present embodiment, the connecting wiring pattern 109 is provided on the upper surface 101Ba of the lower substrate 101B, so that the connecting wiring pattern 109 is interposed between the lower substrate 101B and the upper substrate 101A when these substrates are stacked. The pair of lower electrodes 103 and 104 and the pair of connecting electrodes 107 and 108 are provided on the lower surface of the stacked substrate 101, i.e., on the lower surface 101Bb of the lower substrate 101B so as to be slightly spaced away from the corners. Therefore, the spacing between the electrodes is smaller than that in the preceding embodiment. Providing the connecting wiring pattern 109 between the upper and lower substrates is effective to prevent short-circuits caused by, for example, excessive solder.

Figure 16A:
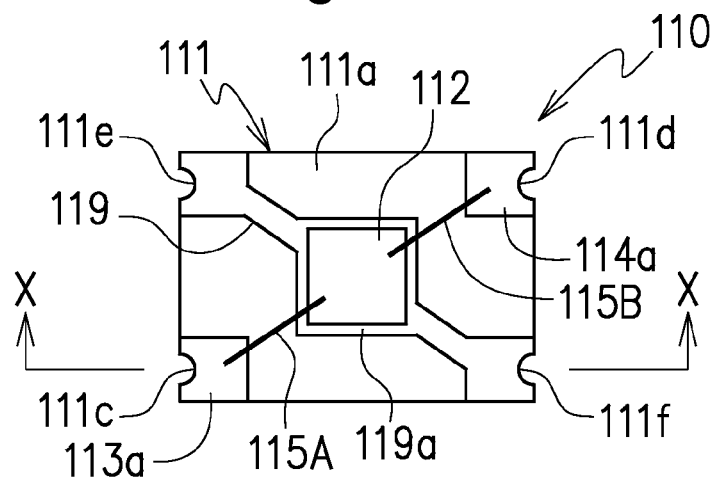
FIG. 16A is a plan view of an LED according to a sixth embodiment of the present invention.
Figure 16B:
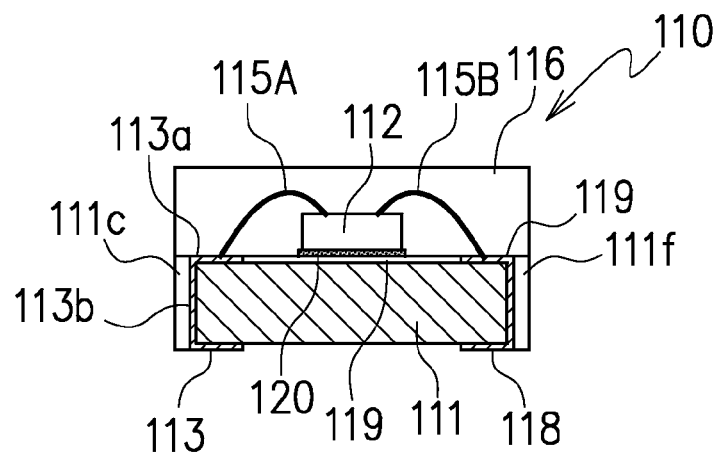
FIG. 16B is a cross-sectional view taken along line X-X in FIG. 16A.
Figure 16C:
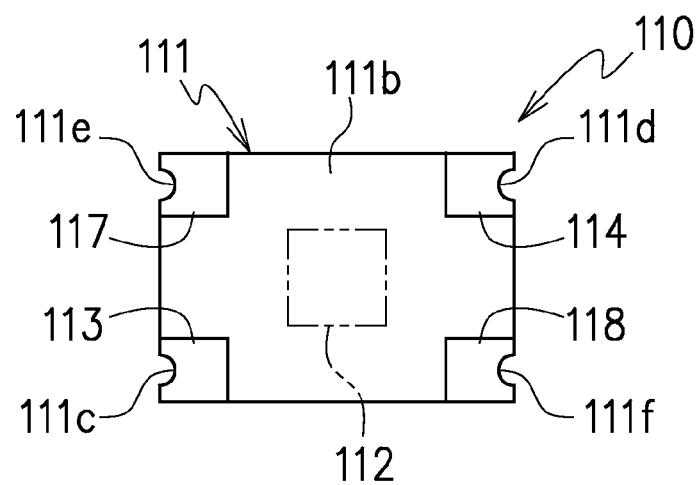
FIG. 16C is a transparent view from the upper side, illustrating the lower surface of the LED shown in FIG. 16A.

FIGS. 16A to 16C show an LED 110 according to a sixth embodiment of the present invention. As shown in FIG. 16A, the LED 110 of the present embodiment is characterized by including, on the upper surface 111a side of a substrate 111, a pair of connecting electrodes and a connecting wiring pattern 119 that connects the pair of connecting electrodes and passes between the lower surface of an LED element 112 and the upper surface 111a of the substrate 111. Upper electrodes and through-holes 111c, 111d, 111e, and 111f are provided at the four corners of the substrate 111, and two of the upper electrodes which are provided on a first diagonal line serve as connecting electrodes. Namely, the connecting wiring pattern 119 connects the through-holes 111e and 111f using the upper electrodes as the connecting electrodes. The connecting wiring pattern 119 has a broadened portion 119a provided in its substantially central portion with a large area, and the LED element 112 is mounted on the upper surface of the broadened portion 119a. The LED element 112 is secured using a material 120, such as solder or silver paste, having high thermal conductivity. The LED element 112 used in the present embodiment includes a p-electrode portion and an n-electrode portion on the upper surface side.

The electrodes provided on the upper surface 111a side of the substrate 111 include a pair of upper electrodes 113a and 114a that are provided at positions corresponding to the through-holes 111c and 111d at the corners on a second diagonal line. The upper electrode 113a functioning as an anode electrode is connected to the p-electrode portion of the LED element 112 through a bonding wire 115A, and the upper electrode 114a functioning as a cathode electrode is connected to the n-electrode portion of the LED element 112 through a bonding wire 115B.

As shown in FIG. 16C, a lower electrode 113 is provided on the lower surface 111b side of the substrate 111 and is located at a position corresponding to the position of the through-hole 111c. The lower electrode 113 is connected to the upper electrode 113a on the upper surface side through a through-hole electrode pattern 113b. A lower electrode 114 is provided at a position corresponding to the through-hole 111d and is connected to the upper electrode 114a on the upper surface side through a through-hole electrode pattern (not shown).

Therefore, current supplied from a mounting substrate to the lower electrode 113 flows through the upper electrode 113a and the bonding wire 115A to the LED element 112, and the LED 110 thereby emits light. The current then flows from the LED element 112 to the lower electrode 114 through the bonding wire 115B and the upper electrode 114a.

A connecting electrode 117 is provided at a position corresponding to the position of the through-hole 111e, and a connecting electrode 118 is provided at a position corresponding to the position of the through-hole 111f. The pair of connecting electrodes 117 and 118 are connected to the connecting wiring pattern 119 to provide electric continuity. A light-transmitting sealing resin 116 for protecting the LED element 112, the bonding wires 115A and 115B, the connecting wiring pattern 119, the upper electrodes 113a and 114a, and the like, is provided on the upper surface 111a side of the substrate 111.

A mounting substrate on which the LEDs 110 configured as above are mounted has a structure similar to the structure shown in FIG. 2. A plurality of the LEDs 110 are mounted in an array in the same mounting manner shown in FIG. 3. The operational advantage of this mounting structure is the same as that described in the preceding embodiment, and the description thereof will be omitted.

In the present embodiment, the connecting wiring pattern 119 is provided on the upper surface 111a side of the substrate 111. Therefore, only the pair of lower electrodes 113 and 114 and the pair of connecting electrodes 117 and 118 are provided on the lower surface 111b side. In this configuration, the electrodes are provided with sufficient spacings therebetween. Even if an excessive amount of solder is used when the LEDs are mounted on the mounting substrate, the risk of contact between the electrodes is eliminated, so that high mounting quality can be obtained with high reliability while short-circuits or like defects can be prevented.

The connecting wiring pattern 119, as well as the pair of upper electrodes 113a and 114a, the pair of lower electrodes 113 and 114, and the pair of connecting electrodes 117 and 118, is formed of a material, such as copper, silver, or gold, having a small electric resistivity and a high thermal conductivity. Moreover, since the connecting wiring pattern 119 has the broadened portion 119a having a larger area than the area of the LED element 112, the heat generated by the LED element 112 is sufficiently absorbed by and dissipated from the connecting wiring pattern 119, and a high heat dissipation effect is obtained.

In the sixth embodiment, one connecting wiring pattern is provided. However, if a plurality of (two or three) connecting wiring patterns are required, a stacked substrate may be used as in the preceding embodiment.

Figure 17A:
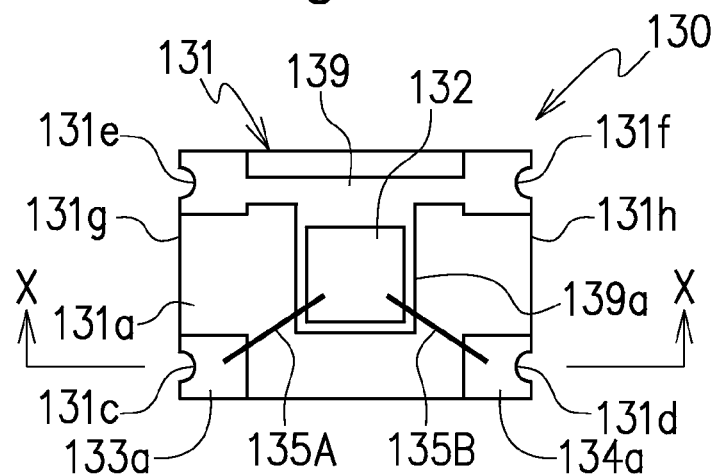
FIG. 17A is a plan view of an LED according to a seventh embodiment of the present invention.
Figure 17B:
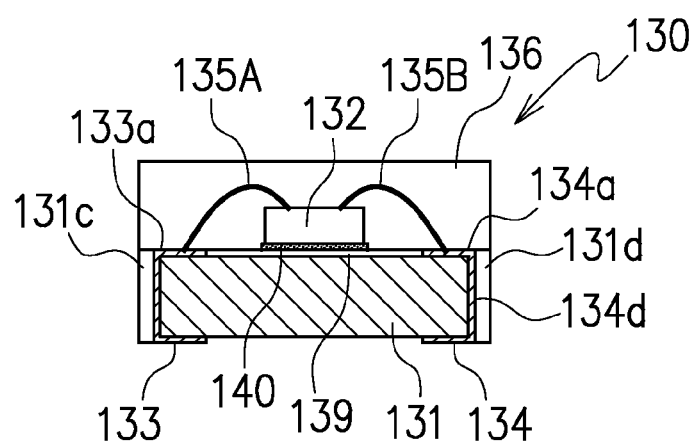
FIG. 17B is a cross-sectional view taken along line X-X in FIG. 17A.
Figure 17C:
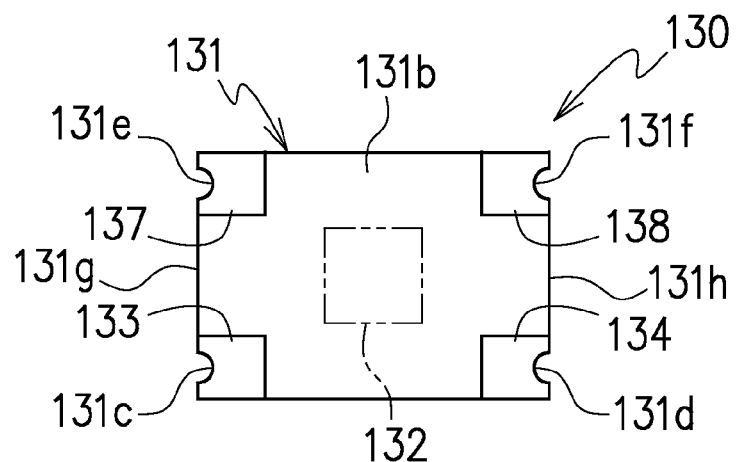
FIG. 17C is a transparent view from the upper side, illustrating the lower surface of the LED shown in FIG. 17A.
Figure 18:
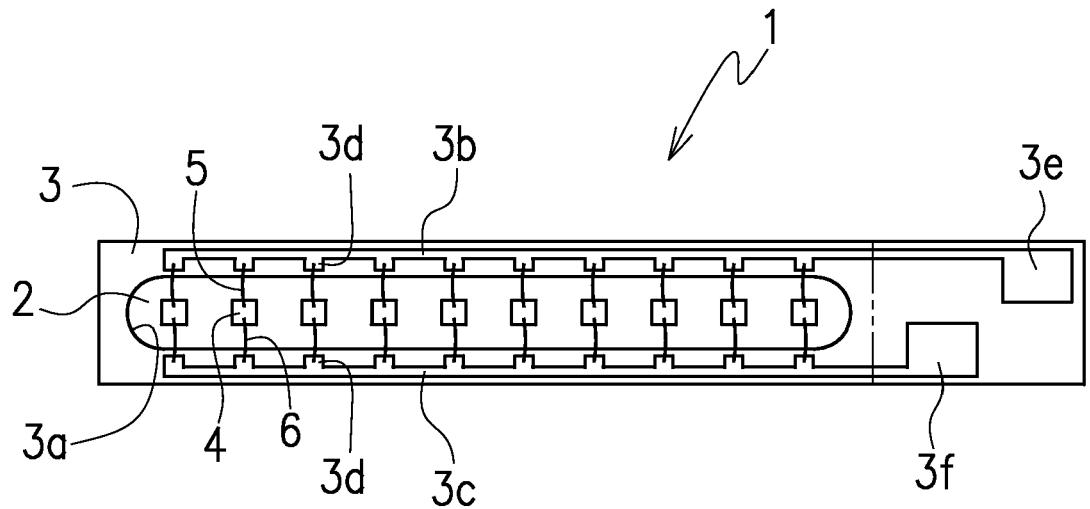
FIG. 18 is a plan view of a conventional LED light source unit.
Figure 19:
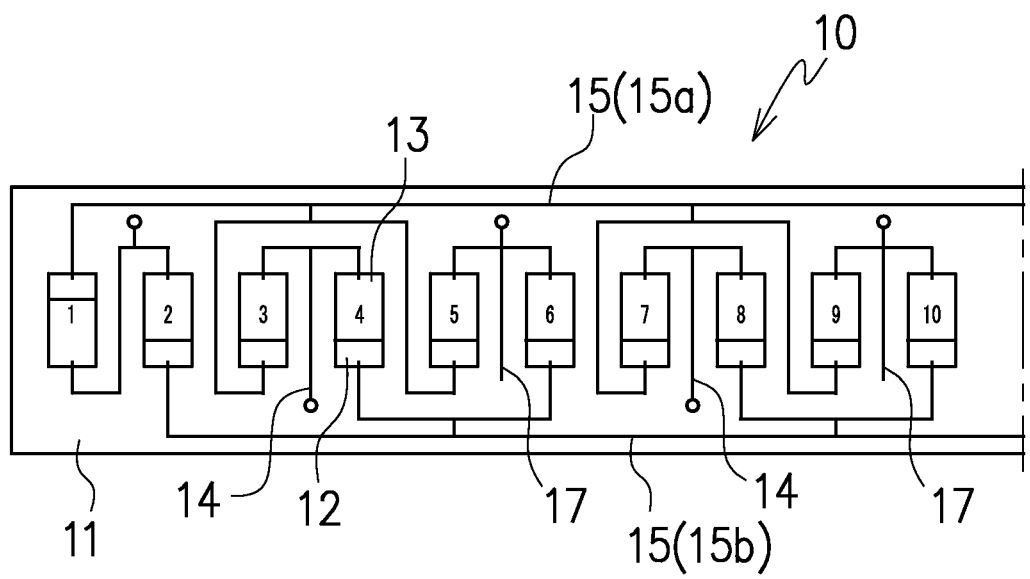
FIG. 19 is a plan view of a conventional light-emitting diode array.

FIGS. 17A to 17C show an LED 130 according to a seventh embodiment of the present invention. As in the preceding embodiment, the LED 130 of the present embodiment includes a connecting wiring pattern 139 provided on the upper surface 131a of a substrate 131. More specifically, as shown in FIG. 17A, through-holes 131c, 131d, 131e, and 131f are provided at four corners of the substrate 131. The connecting wiring pattern 139 is provided for connecting the through-holes 131e and 131f at the upper adjacent corners on the left and right opposed edges 131g and 131h.

The connecting wiring pattern 139 extends to the central portion of the substrate 131 and has a broadened portion 139a formed in a portion for mounting an LED element 132. As shown in FIG. 17B, the LED element 132 is secured to the broadened portion 139a using a material 140, such as solder or silver paste, having high thermal conductivity. With this configuration, a high heat dissipation effect can be expected as in the sixth embodiment. As shown in FIG. 17C, the connecting wiring pattern 139 is connected through the through-holes 131e and 131f to connecting electrodes 137 and 138 provided on the lower surface 131b of the substrate 131.

The positional relationship between a pair of upper electrodes 133a and 134a and a pair of lower electrodes 133 and 134 and the positional relationship between bonding wires 135A and 135B for connecting the LED element 132 to the pair of upper electrodes 133a and 134a are the same as those in the second embodiment, and the detailed description thereof will be omitted.

The LEDs 130 configured as above are mounted on a mounting substrate in the same mounting manner as in the third embodiment shown in FIG. 8. More specifically, the LEDs 130 are mounted on the mounting substrate and the orientation of every other LED 130 is changed (reversed). In this mounting manner, the width (the width in the vertical direction of the substrate in FIG. 17A) of the LEDs 130 can be reduced, and the mounting area on the mounting substrate can be reduced, so that the mounting substrate can be reduced in size. In addition, the heat dissipation characteristics are improved. Since the mounting manner is the same as that in the third embodiment, the detailed description thereof will be omitted.

As has been described, even when a plurality of the LEDs according to the present invention are disposed in one or a plurality of rows, a reduction in size can be achieved. Since the wiring patterns are simplified, the manufacturing cost is effectively reduced. In addition, a plurality of LEDs can be selectively turned on in an easy manner, and the brightness of the lighting can be controlled in a simple manner.

While some embodiments of the present invention have been described above, the present invention is not limited to these embodiments. It is to be understood that various modifications and variations may be made to these embodiments.

What is claimed is:

1. A light-emitting diode, comprising:
a substrate including an upper surface, a lower surface, and a peripheral side surface between the upper surface and the lower surface;
a light-emitting diode element mounted on the upper surface of the substrate; and
a sealing member that covers the light-emitting diode element,
the substrate including, on the lower surface thereof,
at least one pair of lower electrodes electrically connected to the light-emitting diode element, and at least one pair of connecting electrodes, and
a connecting wiring pattern disposed between the at least one pair of connecting electrodes and electrically connecting the at least one pair of connecting electrodes,
wherein the substrate has a rectangular shape and the at least one pair of lower electrodes are disposed adjacent to first two diagonally opposite corners of the substrate, and wherein the at least one pair of connecting electrodes are disposed adjacent to second two diagonally opposite corners of the substrate.

2. The light-emitting diode according to claim 1, wherein the substrate is a single-layer substrate.

3. The light-emitting diode according to claim 1, wherein the connecting wiring pattern is disposed on the lower surface of the substrate.

4. The light-emitting diode according to claim 1, wherein the connecting wiring pattern is disposed on the upper surface of the substrate.

5. The light-emitting diode according to claim 1, wherein the at least one pair of lower electrodes are disposed adjacent to mutually opposed edge portions of the substrate, respectively, and the at least one pair of connecting electrodes are disposed adjacent to the mutually opposed edge portions of the substrate, respectively and spaced apart from the at least one pair of lower electrodes.

6. The light-emitting diode according to claim 1, wherein the at least one pair of connecting electrodes comprise at least two pairs of connecting electrodes that are disposed spaced apart from the at least one pair of lower electrodes.

7. The light-emitting diode according to claim 6, wherein the connecting wiring pattern comprises at least two connecting wiring patterns each connecting electrodes of each pair of the at least two pairs of connecting electrodes, and the at least two connecting wiring patterns are disposed apart on a single plane.

8. A light-emitting diode lighting apparatus, comprising:
a plurality of light-emitting diodes according to claim 1;
a mounting substrate on which the plurality of light-emitting diodes are mounted, and
the mounting substrate including a plurality of wiring patterns that provide electrical connections for the at least one pair of lower electrodes and the at least one pair of connecting electrodes of each of the plurality of light-emitting diodes.

9. A light-emitting diode lighting apparatus, comprising:
a plurality of light-emitting diodes according to claim 1; and
a mounting substrate on which the plurality of light-emitting diodes are mounted,
the plurality of light-emitting diodes disposed on the mounting substrate in at least one row, and
each of the light-emitting diode elements being electrically connected to every other light-emitting diode elements in adjacently disposed light-emitting diodes.

10. The light-emitting diode lighting apparatus according to claim 8,
wherein the plurality of wiring patterns on the mounting substrate are disposed at regular intervals.

11. The light-emitting diode lighting apparatus according to claim 9,
wherein one of the pair of lower electrodes of each of the plurality of light-emitting diodes is electrically connected to one of the at least one pair of connecting electrodes of an adjacent one of the plurality of light-emitting diodes.

12. The light-emitting diode lighting apparatus according to claim 9,
wherein one of the at least one pair of connecting electrodes of the each of the plurality of light-emitting diodes is electrically connected to one of the pair of lower electrodes of the adjacent one of the plurality of light-emitting diodes.

13. A light-emitting diode comprising,
a substrate including an upper surface, a lower surface, and a peripheral side surface between the upper surface and the lower surface;
a light-emitting diode element mounted on the upper surface of the substrate; and
a sealing member that covers the light-emitting diode element,
the substrate including, on the lower surface thereof,
at least one pair of lower electrodes electrically connected to the light-emitting diode element, and at least one pair of connecting electrodes, and
a connecting wiring pattern disposed between the at least one pair of connecting electrodes and electrically connecting the at least one pair of connecting electrodes,
wherein the substrate is a stacked substrate including at least two layers stacked, and
wherein the connecting wiring pattern is disposed between the at least two layers of the stacked substrate.

14. A light-emitting diode, comprising:
a substrate including an upper surface, a lower surface, and a peripheral side surface between the upper surface and the lower surface;
a light-emitting diode element mounted on the upper surface of the substrate;
a pair of upper electrodes that are disposed near adjacent corners on a first side on the upper surface of the substrate and electrically connected to the light-emitting diode element;
a pair of lower electrodes that are disposed near adjacent corners on the first side on the lower surface of the substrate and electrically connected to the pair of upper electrodes;
at least one pair of connecting electrodes being electrically independent of the light-emitting element that is mounted on the upper surface of the substrate, and being disposed near adjacent corners on a second side on the lower surface of the substrate; and
a connecting wiring pattern that extends parallel to the second side and connects the at least one pair of connecting electrodes.

15. A light-emitting diode, comprising:
- a substrate including an upper surface, a lower surface, and a peripheral side surface between the upper surface and the lower surface;
- a light-emitting diode element mounted on the upper surface of the substrate;
- a pair of upper electrodes that are disposed adjacent to first opposite corners on the upper surface of the substrate and electrically connected to the light-emitting diode element;
- a pair of wires that electrically connect the light-emitting diode element to the pair of upper electrodes;
- a pair of connecting electrodes that are disposed adjacent to second opposite corners on the upper surface of the substrate;
- a connecting wiring pattern disposed on the upper surface of the substrate and connecting the pair of connecting electrodes;
- a pair of first lower electrodes that are disposed adjacent to first opposite corners on a lower surface of the substrate and electrically connected to the pair of upper electrodes on the upper surface of the substrate;
- a pair of second lower electrodes that are disposed adjacent to second opposite corners on the lower surface of the substrate and electrically connected to the pair of connecting electrodes on the upper surface of the substrate.

16. The light-emitting diode according to claim 15, wherein the pair of upper electrodes and the pair of the first lower electrodes are electrically connected via through-holes that are disposed on the peripheral side surface of the substrate, respectively.

17. The light-emitting diode according to claim 15, wherein the pair of connecting electrodes and the pair of the second lower electrodes are electrically connected via through-holes that are disposed on the peripheral side surface of the substrate, respectively.

18. The light-emitting diode according to claim 15, wherein the connecting wiring pattern disposed on the upper surface of the substrate passes between a lower surface of the light-emitting diode element and the upper surface of the substrate.

* * * * *